(12) United States Patent
Mourrier et al.

(10) Patent No.: US 8,102,192 B2
(45) Date of Patent: Jan. 24, 2012

(54) DC BRUSHED MOTOR DRIVE WITH CIRCUIT TO REDUCE DI/DT AND EMI, FOR MOSFET VTH DETECTION, VOLTAGE SOURCE DETECTION, AND OVERPOWER PROTECTION

(75) Inventors: Andre Mourrier, Sainte Tulle (FR); Kevin Thevenet, Cheval Blanc (FR)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 12/180,671

(22) Filed: Jul. 28, 2008

(65) Prior Publication Data
US 2009/0027096 A1 Jan. 29, 2009

Related U.S. Application Data

(60) Provisional application No. 60/952,334, filed on Jul. 27, 2007.

(51) Int. Cl.
*H03K 3/00* (2006.01)
(52) U.S. Cl. ........................ 327/108; 327/110
(58) Field of Classification Search .......... 327/108–112
See application file for complete search history.

(56) References Cited

U.S. PATENT DOCUMENTS

| | | | | | |
|---|---|---|---|---|---|
| 4,949,213 | A | * | 8/1990 | Sasagawa et al. | 361/91.4 |
| 5,204,563 | A | * | 4/1993 | Jason | 327/436 |
| 6,127,746 | A | * | 10/2000 | Clemente | 307/131 |
| 6,208,185 | B1 | * | 3/2001 | John et al. | 327/170 |
| 6,570,413 | B1 | * | 5/2003 | Kumagai et al. | 327/108 |
| 7,151,401 | B2 | * | 12/2006 | Inoue | 327/434 |
| 7,489,166 | B2 | * | 2/2009 | Honda | 327/108 |
| 7,570,085 | B2 | * | 8/2009 | Ishikawa et al. | 327/108 |

* cited by examiner

*Primary Examiner* — Kenneth B. Wells
(74) *Attorney, Agent, or Firm* — Farjami & Farjami LLP

(57) ABSTRACT

A gate driver for performing gate shaping on a first transistor of having gate, source, and drain terminals, the first transistor being selected from a switching stage of a power switching circuit having high- and low-side transistors series connected at a switching node for driving a load. The gate driver includes the following steps: upon receipt of an ON pulse pre-charging the gate terminal until gate to source terminal voltage equals Vth, controlling the di/dt(ON) flowing in the first transistor while free wheeling current is flowing in a second transistor of the switching stage, and controlling the dv/dt(ON) of the first transistor while a charge on the gate terminal is present; and upon receipt of an OFF pulse controlling the dv/dt(OFF) of the first transistor until free wheeling current is flowing in the second transistor, and controlling the di/dt(OFF) flowing in the first transistor while the gate to source terminal voltage equals Vth.

17 Claims, 28 Drawing Sheets

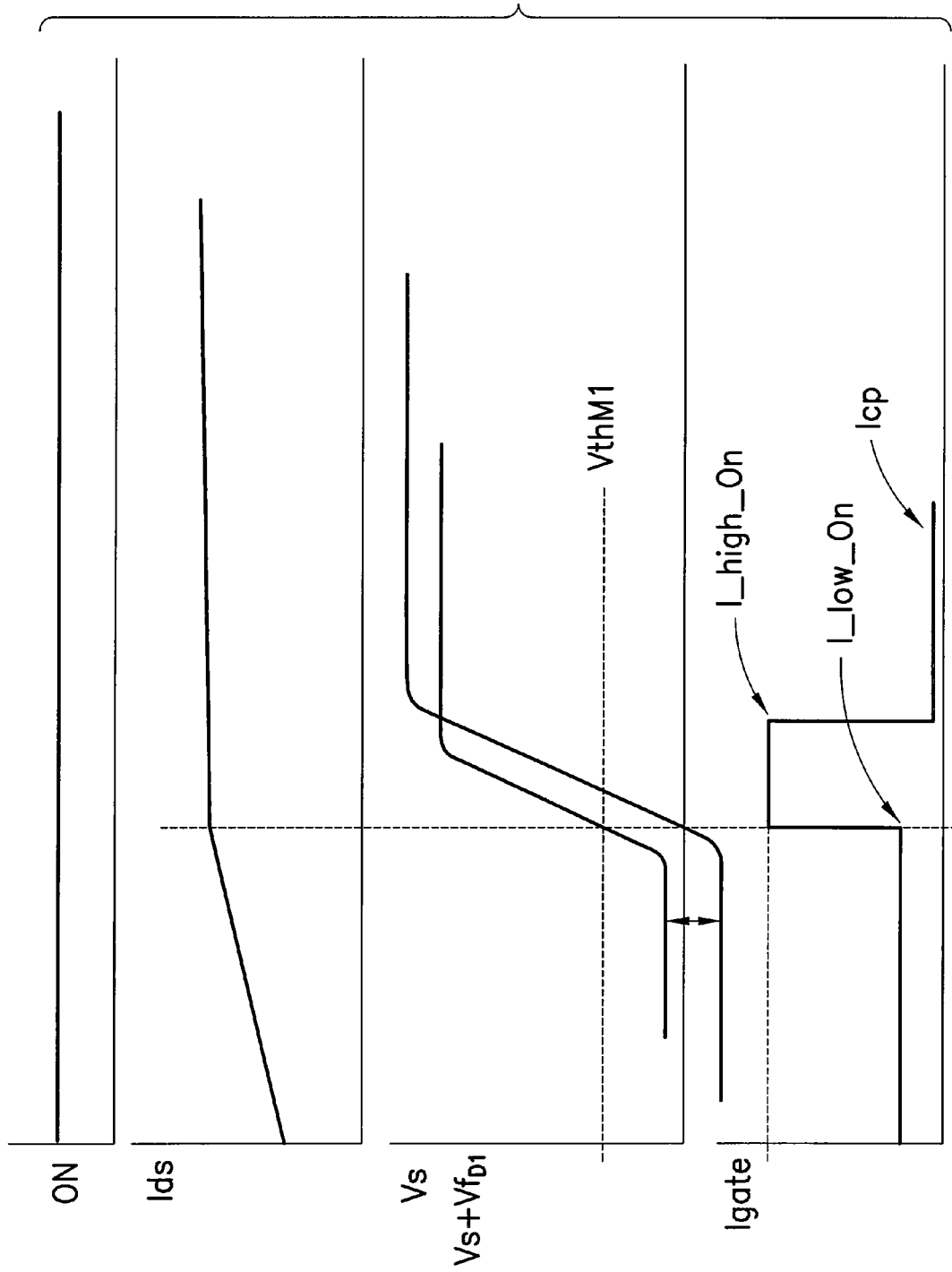

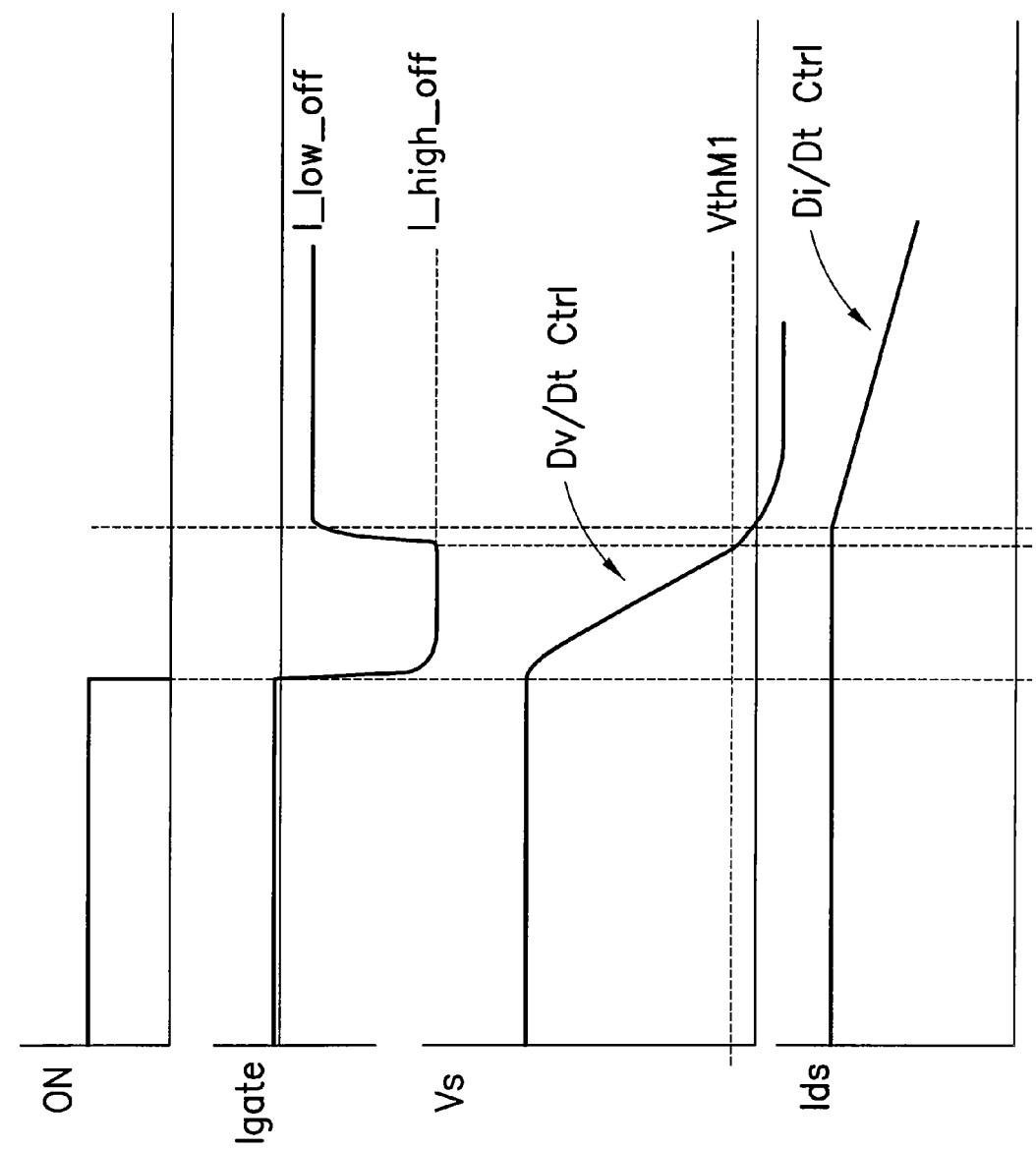

DC BRUSHED MOTOR DRIVE WITH CIRCUIT TO REDUCE DI/DT AND EMI, FOR MOSFET VTH DETECTION, VOLTAGE SOURCE DETECTION, AND OVERPOWER PROTECTION

CROSS-REFERENCE TO RELATED APPLICATION

This application is based on and claims priority to U.S. Provisional Patent Application Ser. No. 60/952,334, filed on Jul. 27, 2007 and entitled DC BRUSHED MOTOR DRIVE WITH CIRCUIT TO REDUCE DI/DT AND EMI, FOR MOSFET VTH DETECTION, VOLTAGE SOURCE DETECTION AND OVERPOWER PROTECTION, the entire contents of which are hereby incorporated by reference.

BACKGROUND OF THE INVENTION

The present invention relates to a new component for switching an inductive load powered at a few kHz, e.g., a motor, a pump, a fan, etc., and more particularly to reducing the EMI and thus the size of an input filter.

Today in the automotive industry 80% of variable speed motor commands are made using a MOSFET drive in linear mode. This kind of drive dissipates a fraction of unused energy in the form of heat, about 110 W for a 450 W motor. 100 W dissipated in the form of heat represents 0.1 liters per 100 Km or 0.1 L/h gas consumption (2 miles per gallon). With the Kyoto Protocol, automotive vendors have to find a way to reduce the $CO_2$ emission and improve the yield of a drive motor. For that reason, a 20 kHz switching drive is now being explored. 20 kHz is not audible to the human ear. This solution can reach up to 90% yield, but can create conduction electromagnetic perturbation (EMI) due to high frequency coupling. To reduce EMI of the input battery filter, the automotive vendors are forced to add a big input filter to a power switching circuit of the motor drive, thereby increasing the final price of the motor drive.

FIG. 1 illustrates the most common solution used to reduce EMI in a power switching circuit driving an inductive load. The power switching circuit includes high- and low-side transistors, e.g., MOSFETs, series connected at a switching node Vs, the switching node driving a load. FIG. 1 shows a source terminal of the high-side transistor Q1 coupled at the switching node Vs to a cathode of a diode Q2 and an inductor L1 (the load) connected between the switching node Vs and ground. In accordance with that solution, resistor Rg is placed in a path of a current Igate providing PWM pulses to a gate terminal of the transistor Q1. The placement of resistor Rg at the gate terminal allows smooth injection of the current in the gate terminal. As shown in FIG. 2, which illustrates gate to source and drain to source voltage and drain to source current when the transistor Q1 is ON and OFF, the drawback of this solution is that the switching losses are maximal, therefore the transistor Q1 heats up a lot.

Another way to reduce the EMI, as illustrated in FIG. 3, was explored a few years ago. The main idea behind this method is to perform gate shaping, i.e., changing the gate profile over time. In particular, FIG. 3 illustrates, in steps 1 and 2 pre-charging of a gate terminal of the transistor Q1 to voltage Vth and to gate to source voltage ON Vgson at step 4 and the effect on load current I.sub.load through the load L1 and the drain to source voltage Vds. This solution takes a huge step forward proving that the gate shaping works, and if it is well set up can reduce the EMI. As voltage Vth value is not known in advance, a complicated loop must be developed to auto-adapt the circuit. After several cycles, pre-charge voltage Vprech may reduce and regulate the turn ON delay with an external consign.

However, applying the same principle for the turn OFF becomes complicated because the source voltage moves very quickly and it becomes very difficult to catch the right event at the right moment. Due to these difficulties an improved, more robust, and easier to manufacture system is necessary.

SUMMARY OF THE INVENTION

It is an object of the present invention to provide a gate driver that will reduce the EMI and minimize switching losses of the transistor of the power switching circuit.

Provided is a gate driving method for performing gate shaping for a first transistor having gate, source, and drain terminals; the first transistor being selected from a switching stage of a power switching circuit having high- and low-side transistors series connected at a switching node for driving a load. The driving method includes the following steps: upon receipt of an ON pulse pre-charging the gate terminal until gate to source terminal voltage equals Vth, controlling the di/dt(ON) flowing in the first transistor while free wheeling current is flowing in a second transistor of the switching stage, and controlling the dv/dt(ON) of the first transistor while a charge on the gate terminal is present; and upon receipt of an OFF pulse controlling the dv/dt(OFF) of the first transistor until free wheeling current is flowing in the second transistor, and controlling the di/dt(OFF) flowing in the first transistor while the gate to source terminal voltage equals the Vth.

Also provided is a gate driver driving method for performing gate shaping for a first transistor having gate, source, and drain terminals, the first transistor being selected from a switching stage of a power switching circuit having high- and low-side transistors series connected at a switching node for driving a load. The gate driving method includes a detection circuit for upon receipt of an ON pulse detecting voltage Vth, the gate driver pre-charging the gate terminal until gate to source terminal voltage equals Vth, a logic control circuit for controlling the di/dt(ON) flowing in the first transistor after receipt of an ON pulse while free wheeling current is flowing in a second transistor of the switching stage, and controlling the di/dt(OFF) flowing in the first transistor after receipt of an OFF pulse while the gate to source terminal voltage equals Vth; a first control circuit for controlling the dv/dt(ON) of the first transistor after receipt of an ON pulse while a charge on the gate terminal is present; and a second control circuit for upon receipt of an OFF pulse controlling the dv/dt(OFF) of the first transistor until free wheeling current is flowing in the second transistor.

Other features and advantages of the present invention will become apparent from the following description of the invention that refers to the accompanying drawings.

BRIEF DESCRIPTION OF THE DRAWINGS

FIG. 7B is a timing diagram of the "End of diode conduction detector" circuit of FIG. 7A;

FIG. 8B is a timing diagram of the "gate discharged to ground" circuit of FIG. 8A;

DETAILED DESCRIPTION OF EMBODIMENTS OF THE INVENTION

The present invention is directed to a gate driver for managing internally controlled di/dt of a transistor, e.g., a MOSFET, by dynamically managing gate voltage. This di/dt trade-off is set internally to the gate driver to an optimum value between power dissipation (switching losses) versus noise (EMI). This feature allows a circuit designer to choose less EMI versus power. Most importantly, the present invention allows to not continue to rely on the closed loop but to find a way to detect all events needed to properly manage the gate shaping.

Figure 4:
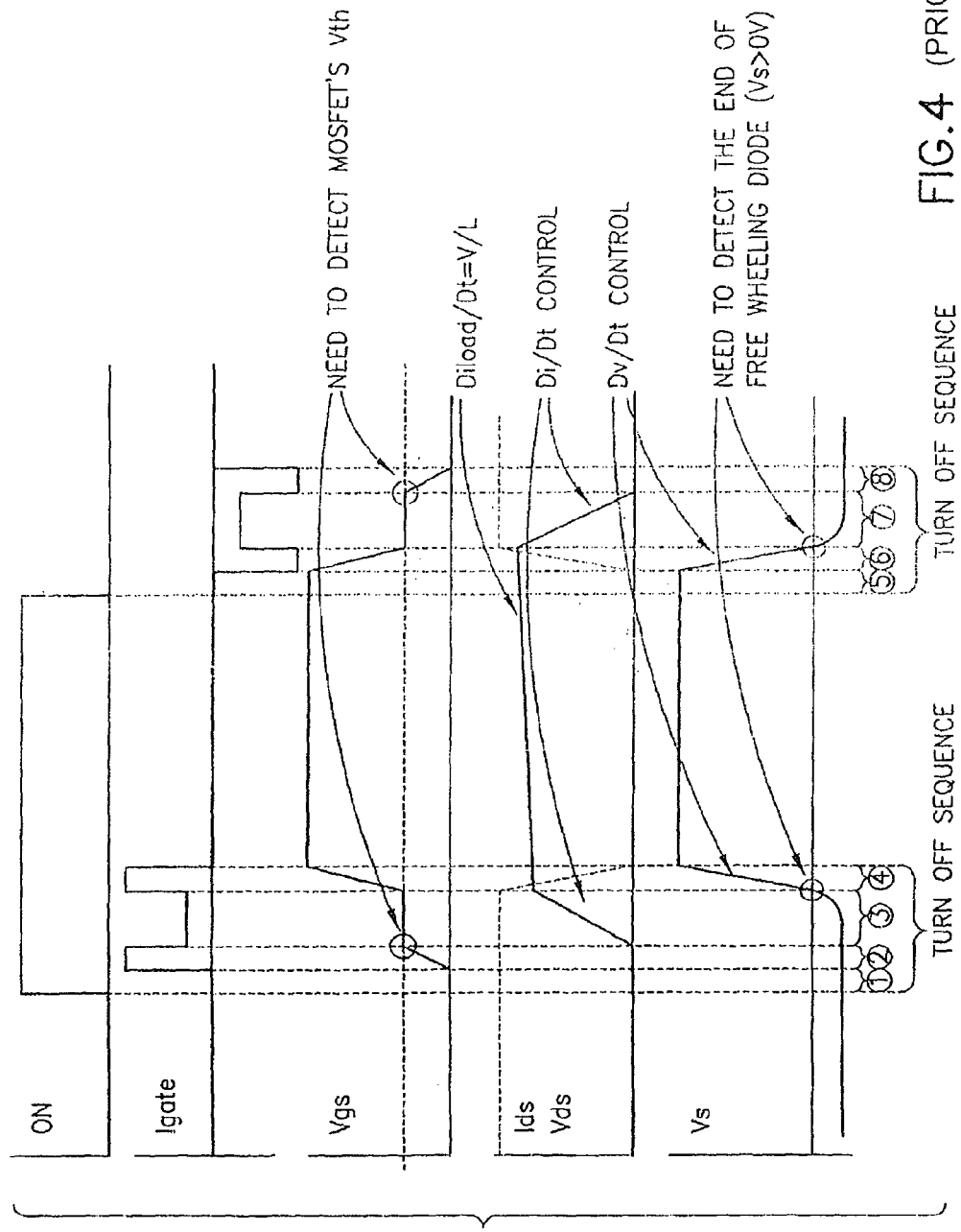
FIG. 4 is a graph showing a gate shaping profile for the switching circuit of FIG. 1.
Figure 5:
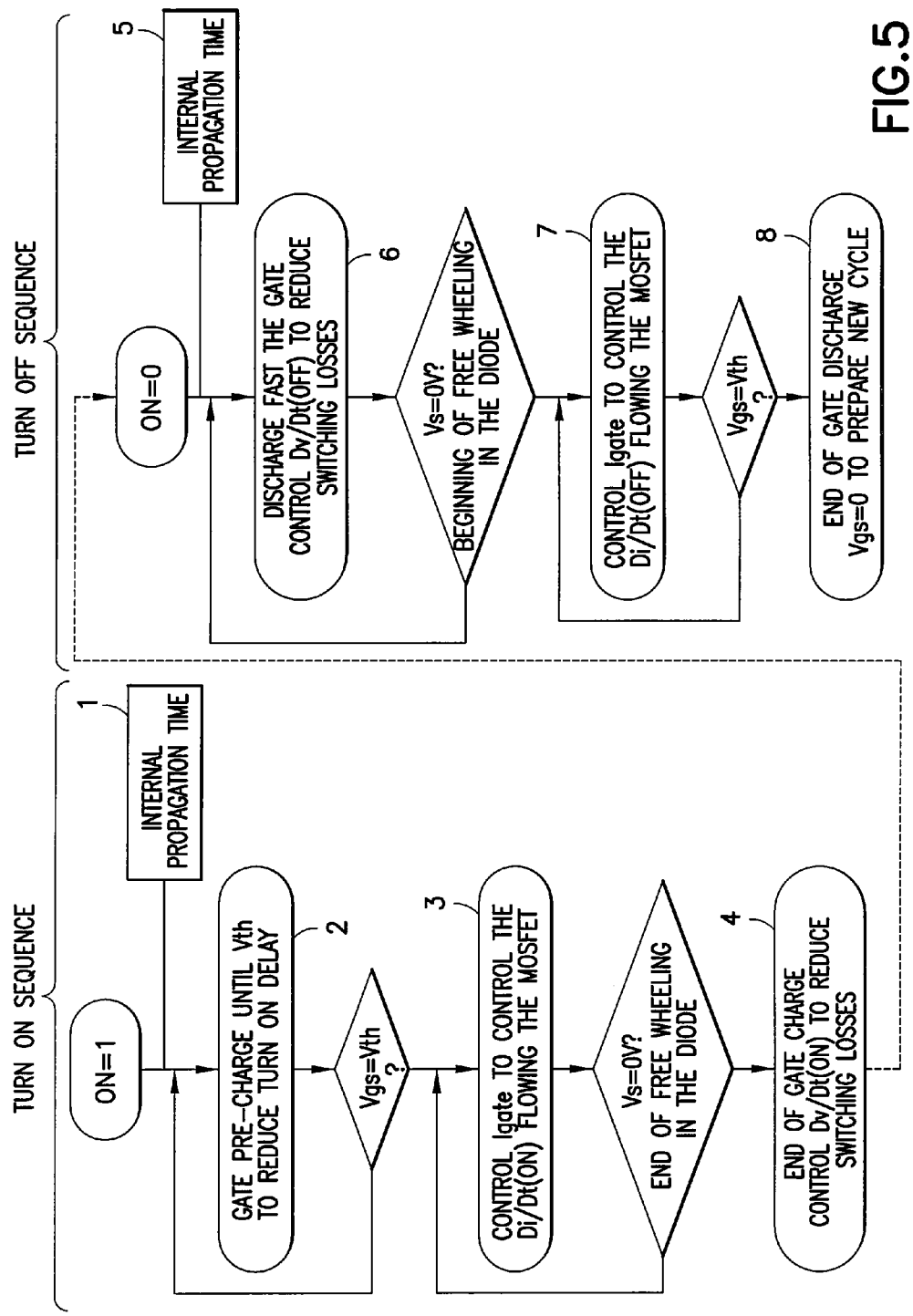
FIG. 5 is a flowchart illustrating a synoptic diagram of a gate profile sequence.

Since, as shown in FIG. 4, every slope of gate voltage changes as a function of an event and not as a function of time, this profile sequence can be translated into the synoptic diagram illustrated in FIG. 5. Accordingly, as shown in FIGS. 4 and 5, the turn ON sequence includes the following steps: After receipt by the MOSFET of an ON pulse, step 1 of the sequence enables passing of internal propagation time. Step 2 reduces turn ON delay by pre-charging the gate terminal of the MOSFET until it reaches voltage Vth, i.e., until gate to source voltage Vgs is equal to Vth. In step 3 the current at the gate Igate of the MOSFET is controlled to control the di/dt (ON) flowing through the MOSFET until the voltage at the source terminal Vs is at zero volt, indicating an end of free wheeling in the diode Q2. At step 4, at the end of the gate being charged, the dv/dt(ON) of the MOSFET is controlled to reduce switching losses.

The turn OFF sequence of the MOSFET includes the following steps: After receipt by the MOSFET of an OFF pulse, step 5 enables passing of the internal propagation time. In step 6 the dv/dt(OFF) of the MOSFET is controlled to reduce switching losses until voltage at the source terminal Vs is at zero volt indicating the beginning of free wheeling in the diode Q2. In step 7, current at the MOSFET gate terminal Igate is controlled to control the di/dt(OFF) flowing through the MOSFET until the gate to source terminal voltage Vgs reaches Vth. At step 8, if the gate to source terminal voltage Vgs reaches zero volt, the gate discharge has ended and the MOSFET is prepared for a new cycle.

MOSFET's Vth Detector

Figure 6A:
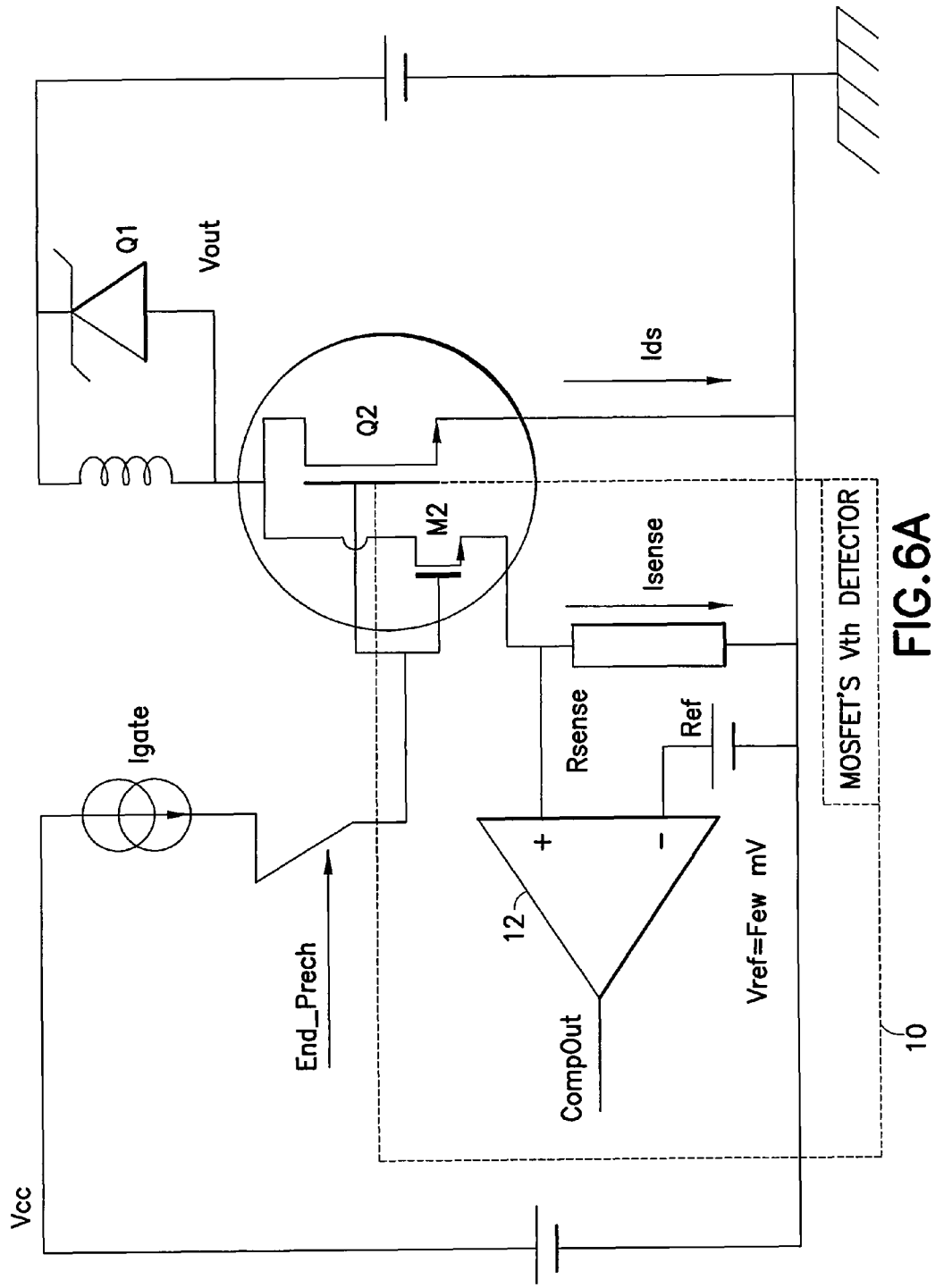
FIGS. 6A and 6B are block diagrams illustrating detection of voltage Vth at the low- and high-side MOSFET of the switching circuit of FIG. 1, respectively.

This section describes step 2 in the diagram of FIG. 5. The challenge is to be able to detect voltage Vth at the MOSFET's gate terminal and when the source terminal reaches and passes by zero volt. The MOSFET's Vth detector circuit 10 is illustrated in FIG. 6A, the circuit 10 detects voltage Vth, current sense MOSFET M2 is used, letting the output current image Isense flow in a resistor Rsense and using a comparator 12 to compare the voltage on the resistor Rsense and a reference voltage. If a voltage drop exists on the resistor Rsense, it means that a current flows in the current sense MOSFET M2. This also means that a small current Ids flows in the low-side main output MOSFET Q2, indicating that voltage Vth is reached.

Figure 6B:
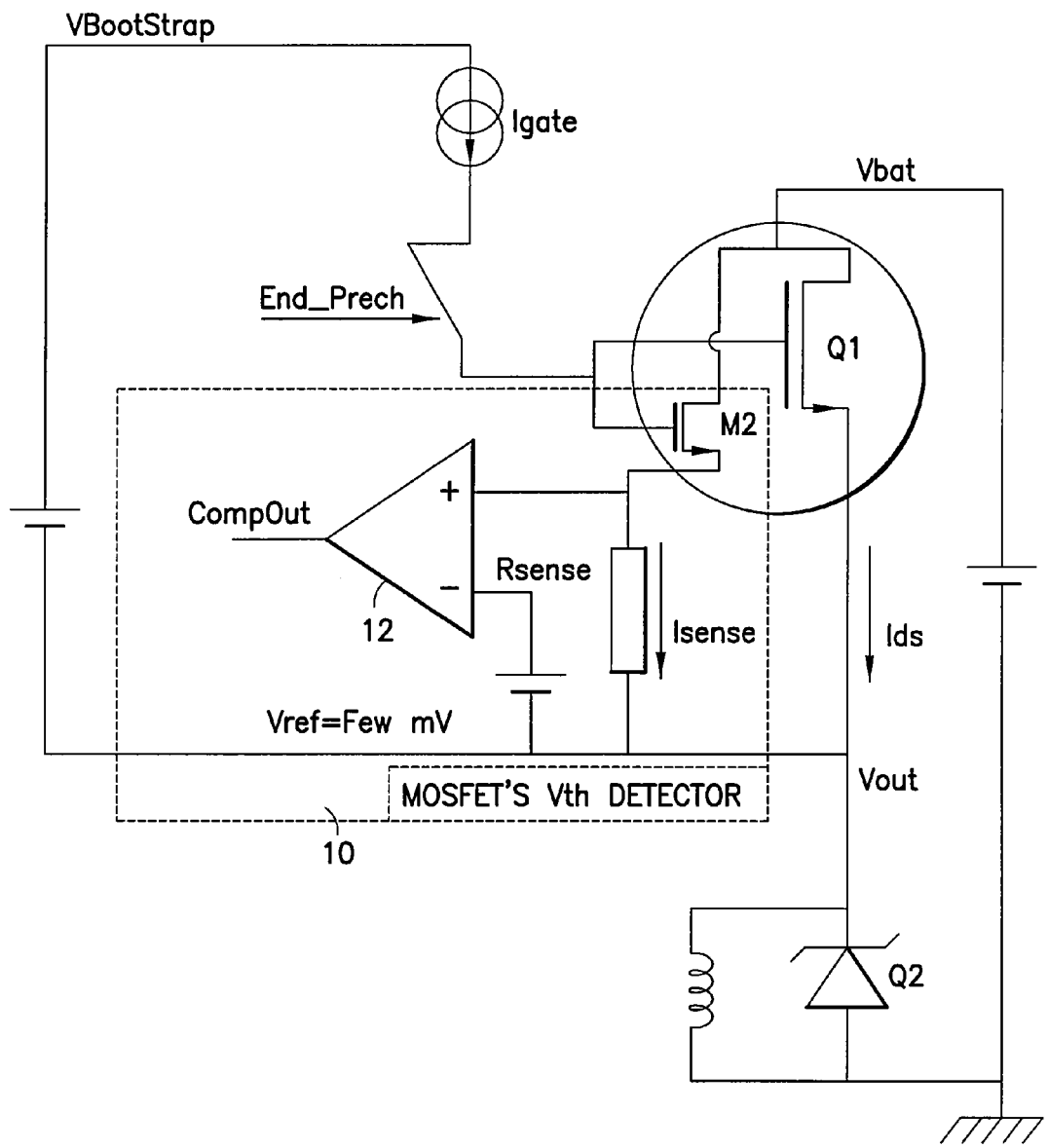

The above makes it possible to compare the voltage drop on the resistor Rsense to the reference voltage, and thus give a two state output, for example "0" logic if the voltage Vgs of the current sense MOSFET M2 is smaller than voltage Vth and "1" if the voltage Vgs of the current sense MOSFET M2 is equal or greater than voltage Vth. FIG. 6B shows detection of voltage Vth on the high side MOSFET Q1.

Figure 6C:
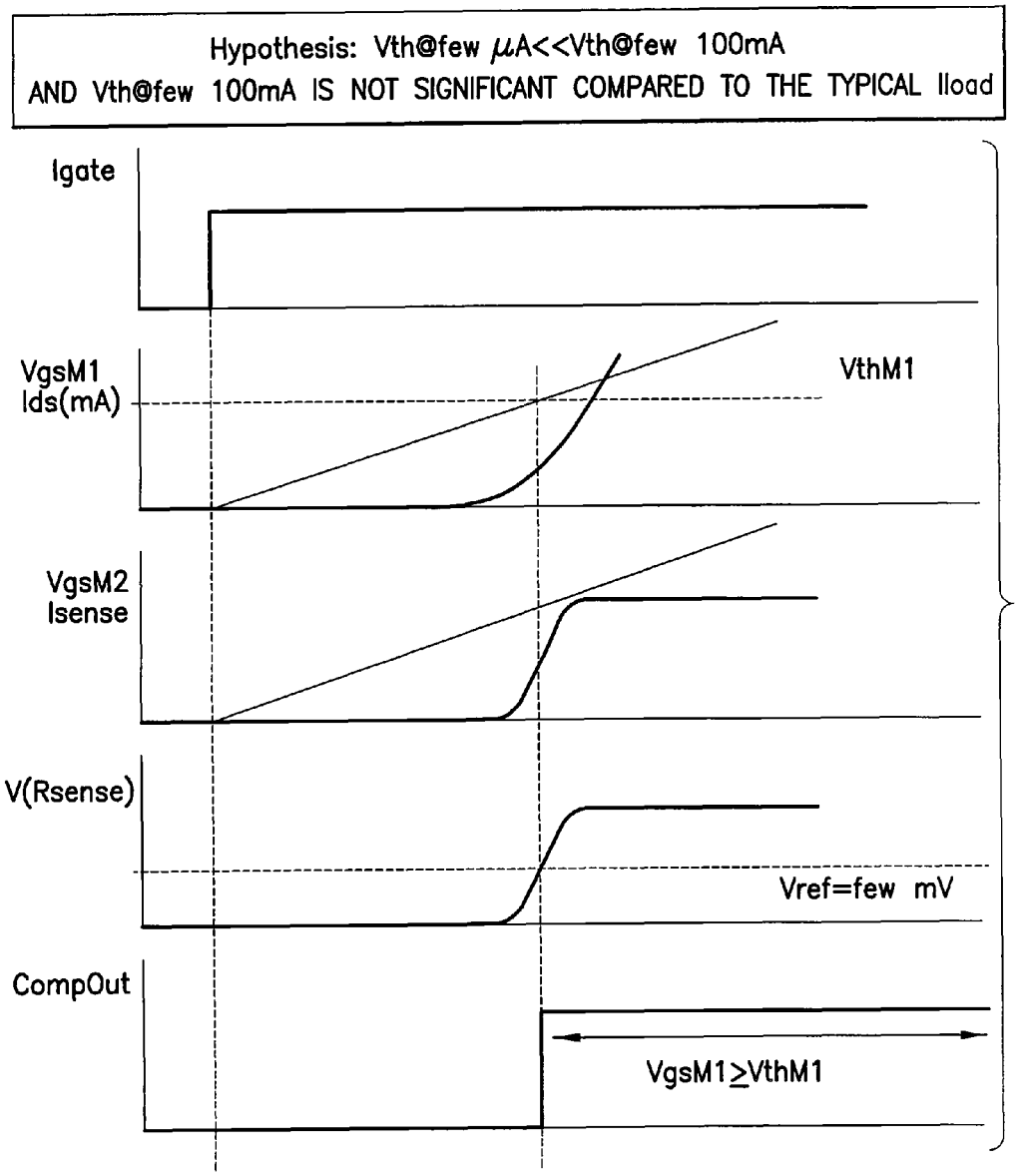
FIG. 6C is a timing diagram of the Vth detection circuit of FIGS. 6A and 6B.

FIG. 6C illustrates a timing diagram of the Vth detection circuit of FIGS. 6A and 6B, showing the current Igate provided to gate terminals of the current sense MOSFET M2 and the high- or low-side MOSFETs Q1 and Q2; gate to source voltage Vgs of the current sense MOSFET M2 and the drain to source current through the high- or low-side MOSFETs Q1 and Q2; gate to source voltage Vgs of the high- or low-side MOSFETs Q1 and Q2 and the current Isense through the resistor Rsense, as well as a voltage Vrsense on resistor Rsense. Finally, FIG. 6C illustrates a CompOut signal generated by the comparator 12. Further, other possible applications of the described "MOSFET's Vth detector" scenario include "control of dead time" and "control of Tdon of two different power MOSFETs.

Figure 6D:
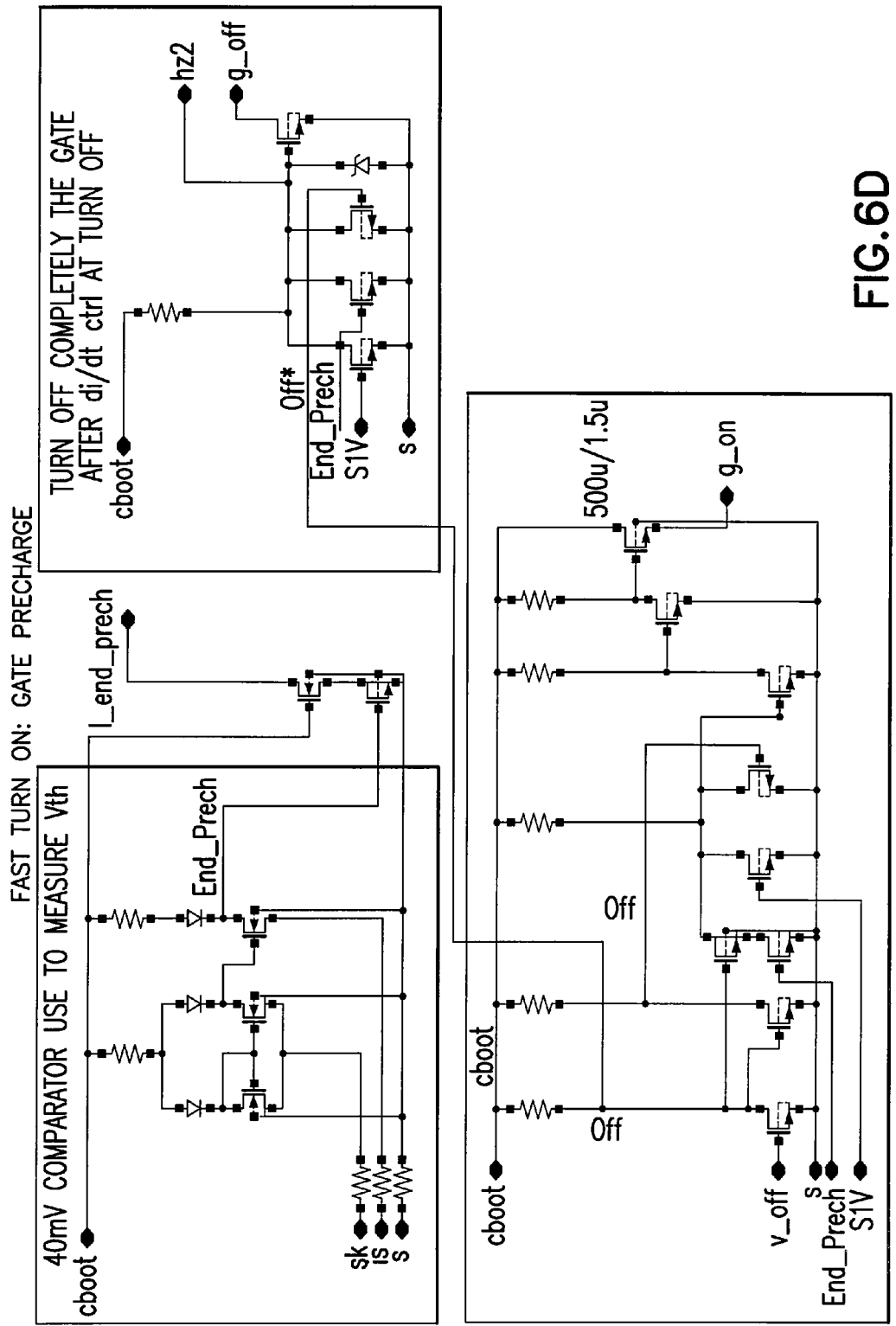
FIG. 6D is a circuit diagram showing an implementation of Vth detection of FIGS. 6A and 6B.

Further, FIG. 6D illustrates a possible embodiment of a fast turn ON Gate pre-charge circuit diagram. The circuit includes a 40 mV Comparator for measuring Vth and a circuit for completely turning OFF the gate after di/dt control at turn OFF.

End of Diode Conduction Detector: Soft dv/dt ON

This section describes step 4 in the diagram of FIG. 5. During a free wheeling state, the source voltage is under 0V (Vs=−Vf diode Q2). When the voltage at Vs rises up after free wheeling, Vs crosses zero volts quickly. To detect this short instance a very quick comparator is needed. But to make a measurement so close to the power supply rail it would be necessary to create a negative charge pump to have enough voltage range to be able to compare a voltage to a reference. What is provided is a simple solution to avoid creating a negative charge pump, using few components to make a highly responsive circuit.

Figure 7A:
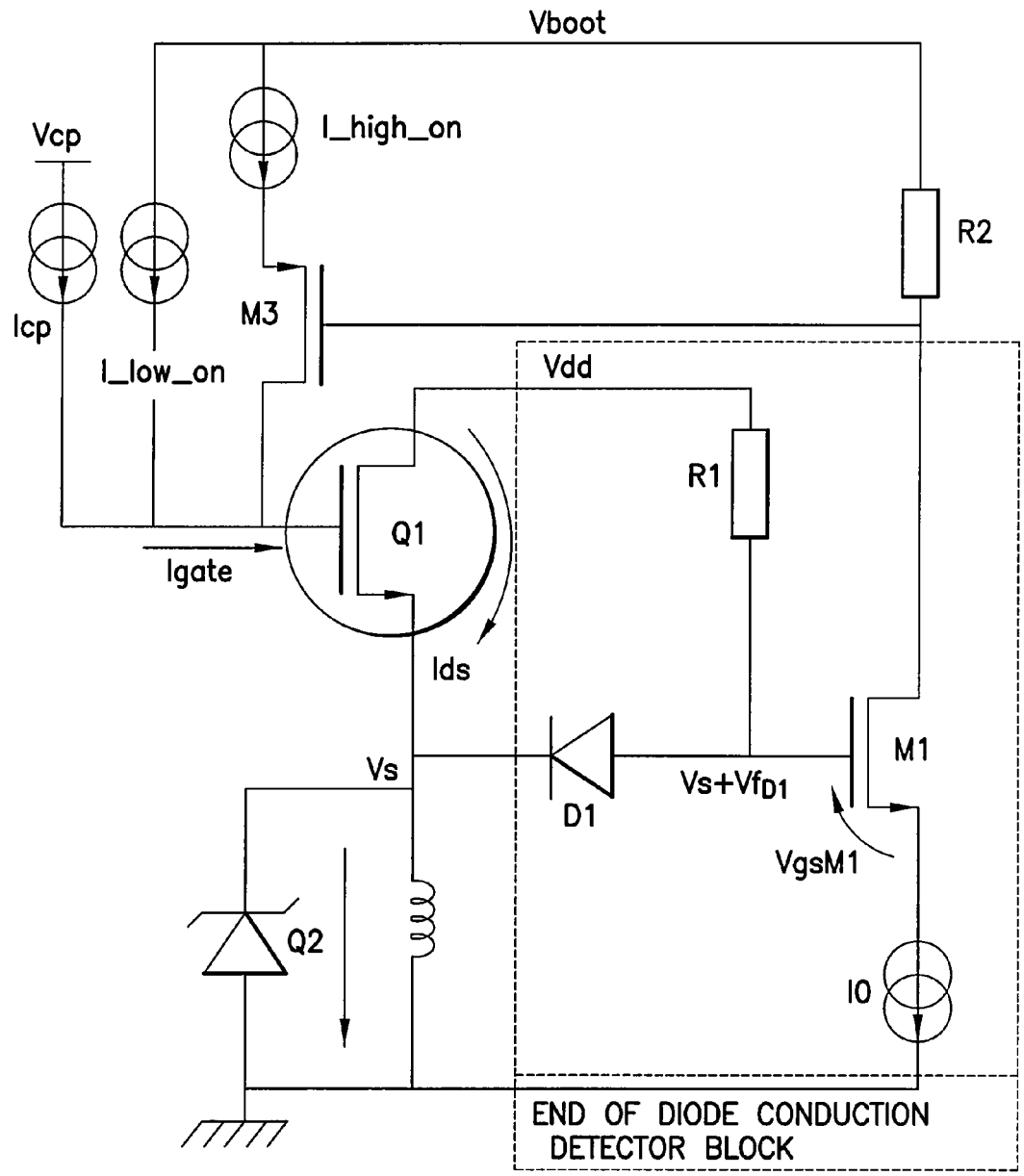
FIG. 7A is a block diagram illustrating a principle of "End of diode conduction detector" circuit of the present invention.

As shown in FIG. 7A, diode D1 is polarized by a resistor R1, so the transistor M1 gate sees Vs+Vf$_{D1}$. When Vs+Vf$_{D1}$ is greater than Vth$_{M1}$, the transistor M1 turns ON and lets flow current I0 to create a voltage drop on a resistor R2 high enough to turn ON the transistor M3. This, as an effect to let flow "l_High_On" in the power MOSFET Q1. A timing diagram of the "End of diode conduction detector" is shown in FIG. 7B. Further, other possible applications of the described "End of diode conduction detector" scenario include High frequency synchronous rectification, dv/dt control driver.

Figure 7C:
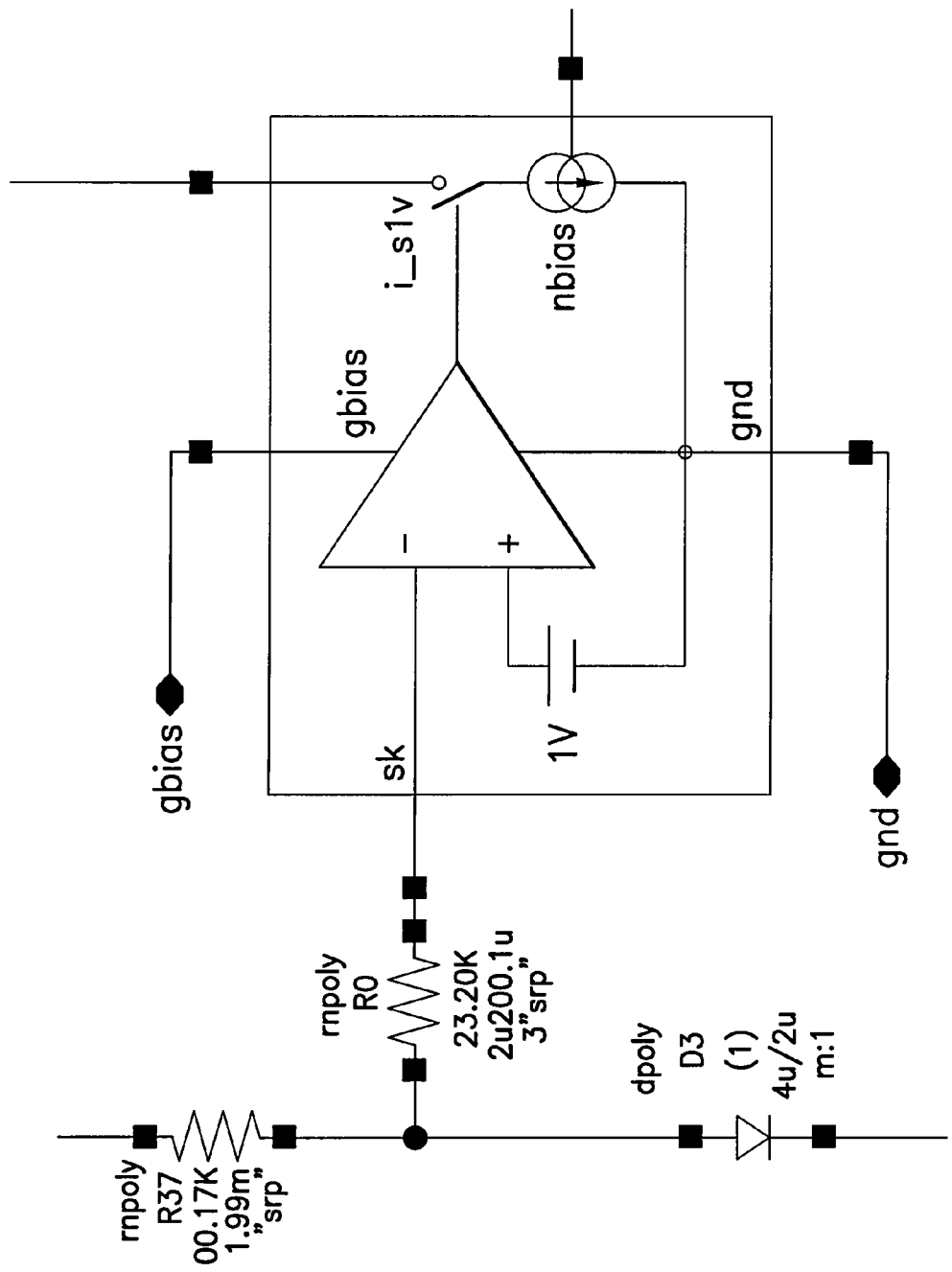
FIGS. 7C and 7D are circuit diagrams showing implementations of the circuit of FIG. 7A.
Figure 7D:
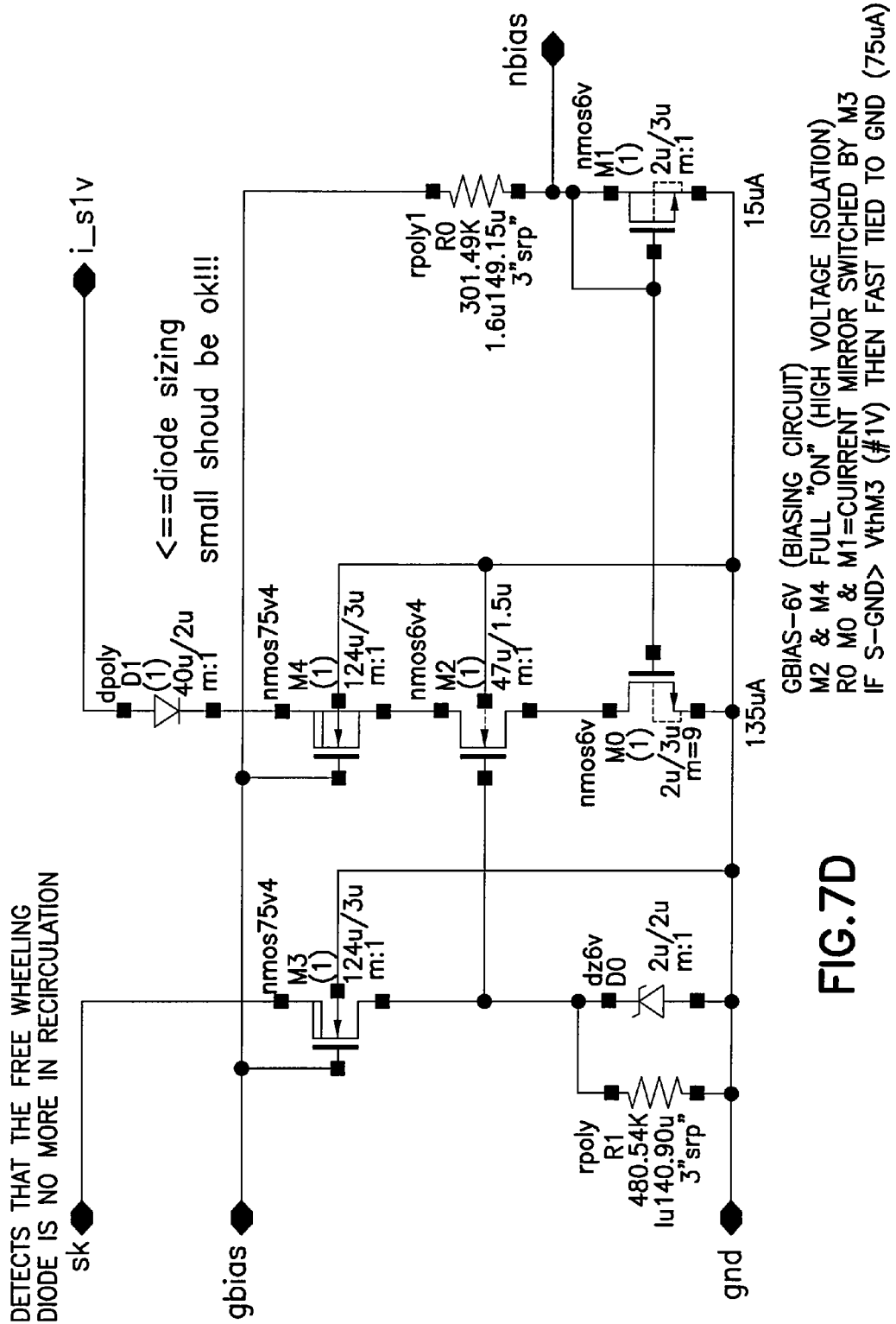

Further, FIGS. 7C and 7D illustrate possible embodiments of the end of diode conduction detector circuits.

Gate Discharge to Ground: Soft dv/dt OFF

Figure 8A:
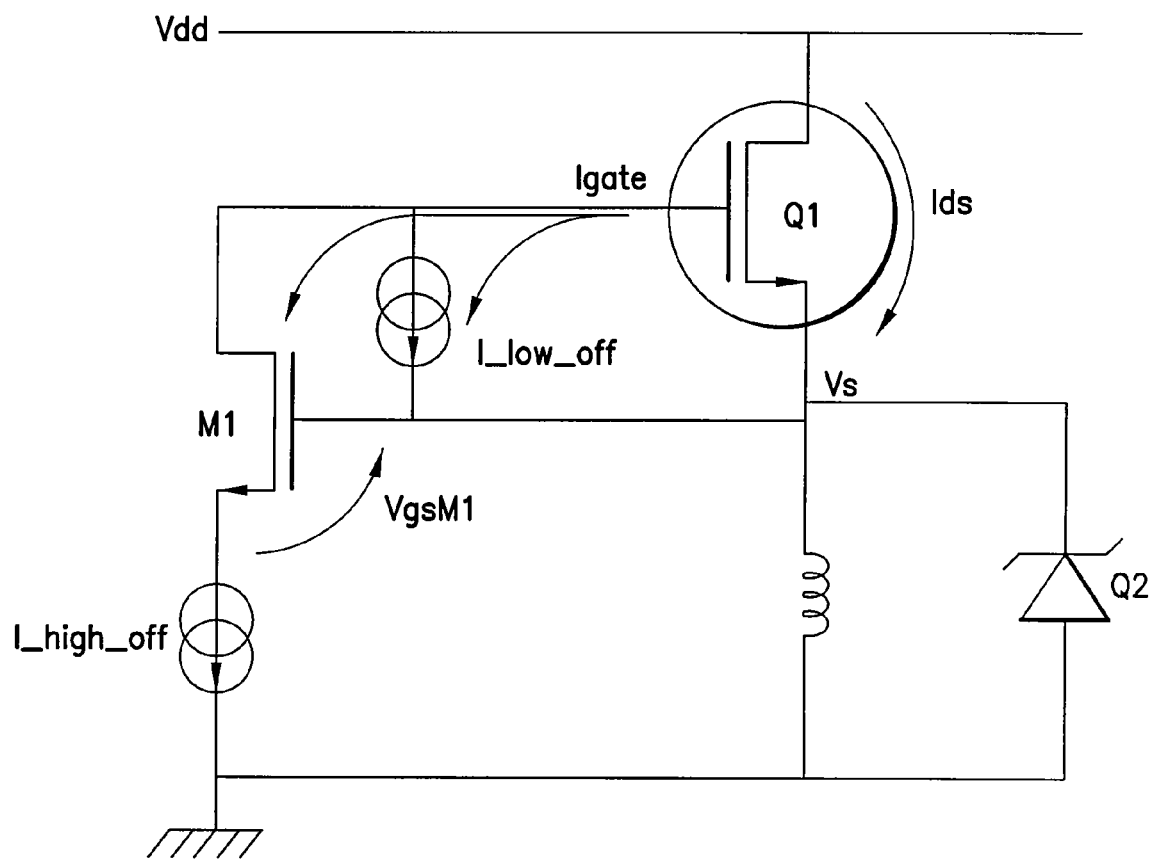
FIG. 8A is a circuit diagram illustrating a principle of "gate discharged to ground" circuit of the present invention.

This section describes step 6 in the diagram of FIG. 5. During this phase, the source (Vs) falls to ground very quickly, so it is very difficult to catch the instant where the source crosses zero volts. Moreover, if the circuit misses the zero cross, the Ids current will go down too quickly and generate EMI perturbation. That is why it is necessary to find a way to be sure to never miss this event. And this is exactly what the "gate discharge to ground" circuit, illustrated in FIG. 8A, does controlling dv/dt.

During the 1st turn-OFF phase.(see step 6 in the synoptic of FIG. 5) the power MOSFET M2 is fully ON (Vs=Vdd) and the "gate discharge to ground" circuit is enabled. As Vs is tied to Vdd, VgsM1 is greater than Vth$_{M1}$, so M1 behaves as a switch with the negligible resistor in series. Thus, Igate=l_high_OFF+l_low_OFF and the source falls. The more the source falls to ground the more M1 is pinched, until complete shutdown when the Vs−Ground=Vth$_{M1}$. This creates a full and smooth control of the Vs voltage, as shown below, since there is no nonlinearity is the gate discharged current. A timing diagram of the "gate discharge to ground: soft dv/dt OFF" is shown in FIG. 8B. Further, other possible applications of the described "gate discharge to ground: soft dv/dt OFF" scenario include a high frequency synchronous rectification, dv/dt control driver.

The described gate discharge to ground creates a soft "S" shape signal, which can be used in other designs for dv/dt control. In such dv/dt control driver, this "S" shape signal helps avoid voltage discontinuity and thus has an effect of reducing EMI when the load is far from the driver.

Figure 8C:
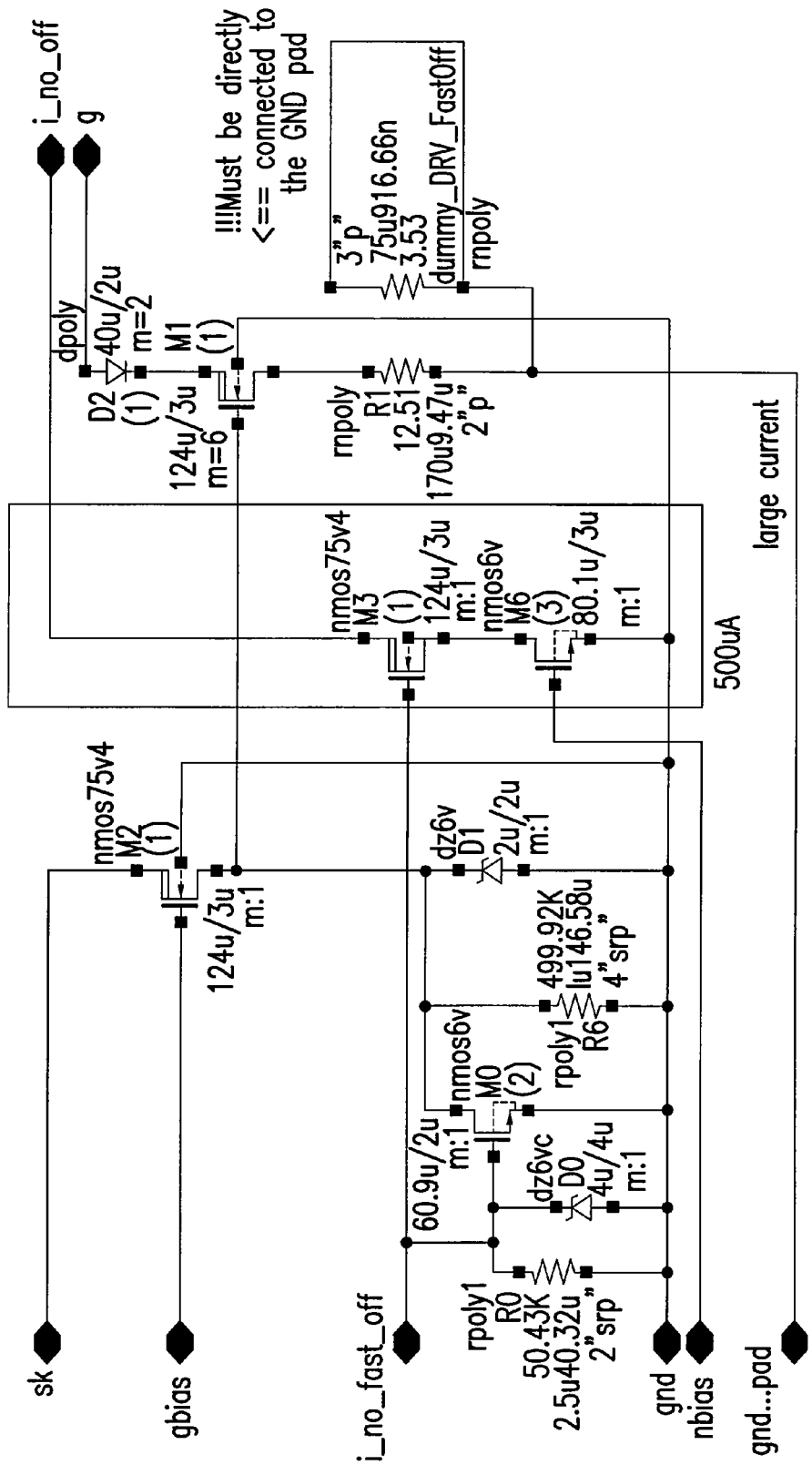
FIG. 8C is a circuit diagram showing implementation of the circuit of FIG. 8A.

Further, FIG. 8C illustrates a possible embodiment of the gate discharge to ground circuit.

di/dt Control MOS Gate Driver

Figure 9A:
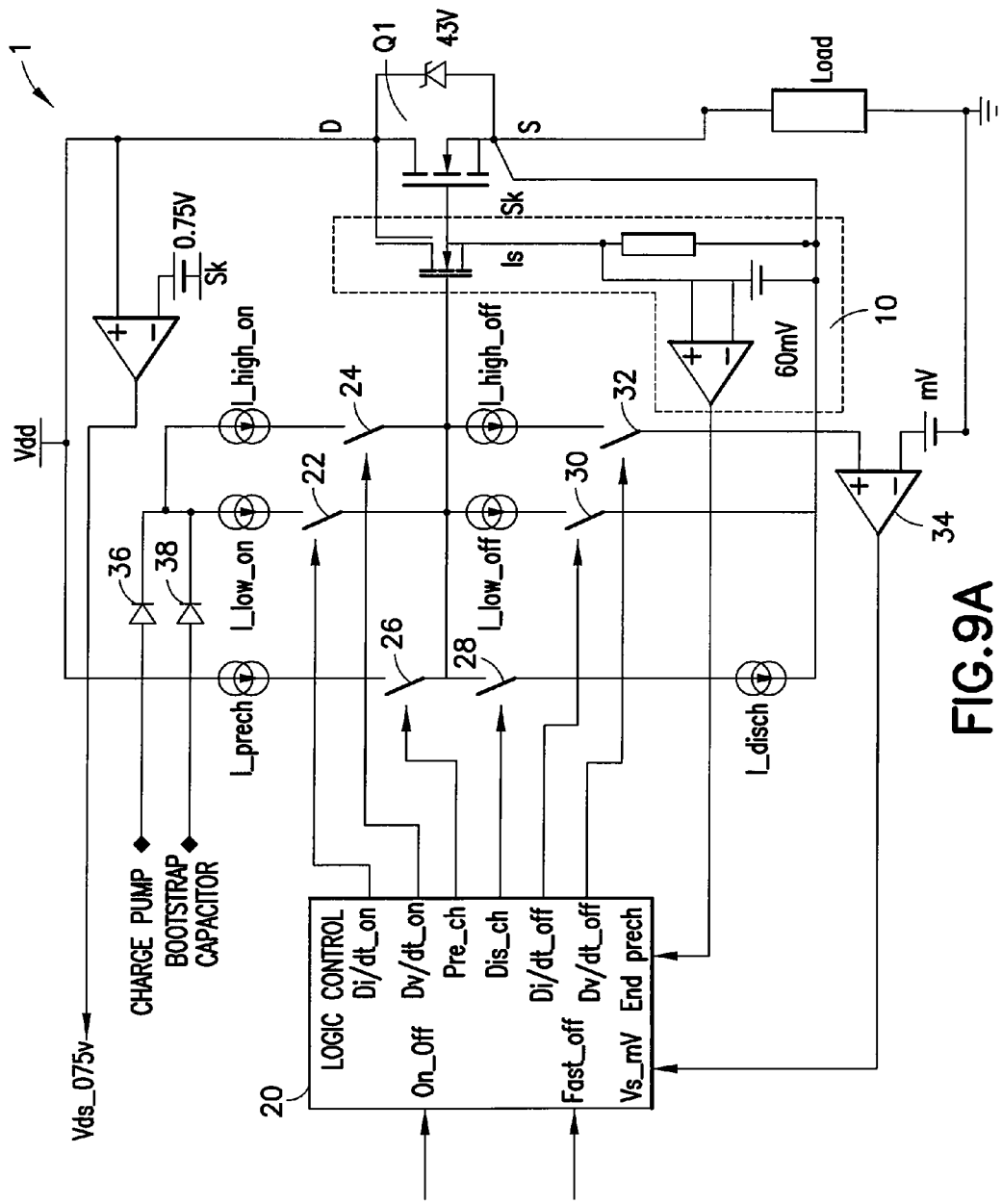
FIG. 9A is a bloc diagram of the di/dt control driver of the present invention.

FIG. 9A illustrates a diagram of a circuit 1 of one embodiment of the present invention including a logic control block that receives input of an ON/OFF signal, a Fast ON signal, a signal indicating detection of voltage at the switching node provided by the detection circuit 10, and a signal provided by a comparator 34 indicating if voltage at the switching node Vs is larger or smaller than a reference voltage mV and providing di/dt and dv/dt ON and OFF signals for controlling the circuit. In particular, the di/dt(ON) signal of the logic control circuit 20 controls a switch 22 to connect/disconnect low ON current source l_low_on to the gate of the power transistor Q1. The dv/dt(ON) signal controls a switch 24 to connect/disconnect high ON current source l_high_on to the gate of the power transistor Q1. Pre-charge signal Pre_ch controls a switch 26 to connect/disconnect pre-charge current source l_prech to the gate of the power transistor Q1. Discharge signal Dis_ch controls a switch 28 to connect/disconnect discharge current source l_disch to the gate of the power transistor Q1. The di/dt(OFF) signal controls a switch 30 to connect/disconnect low OFF current source l_low_off to the gate of the power transistor Ql. The dv/dt(OFF) signal controls a switch 32 to connect/disconnect high OFF current source l_high_off to the gate of the power transistor Q1.

Figure 1:
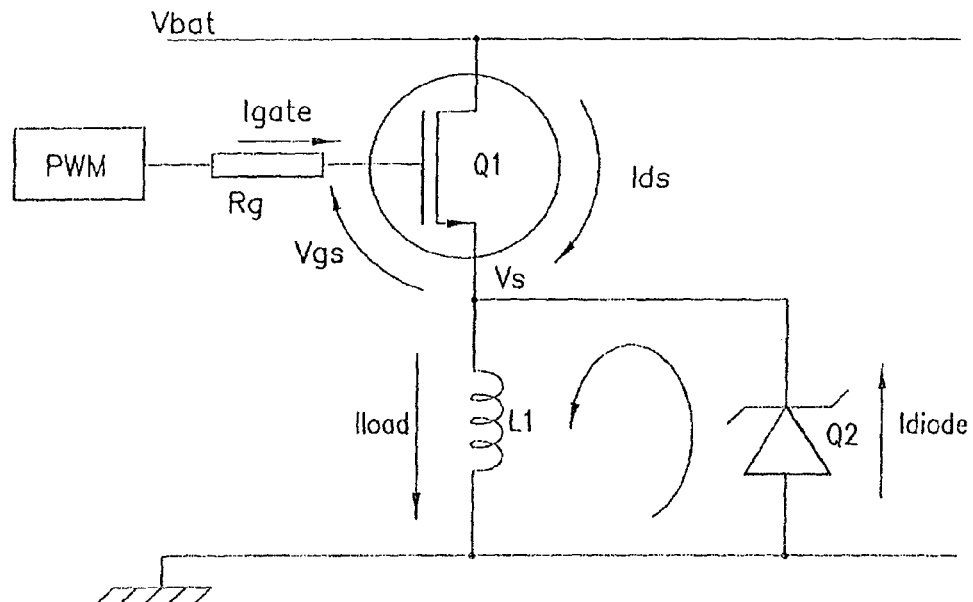
FIG. 1 is a block diagram showing a prior art solution for reducing the EMI in a power switching circuit driving an inductive load where a resistor is placed in the path of the gate terminal.
Figure 2:
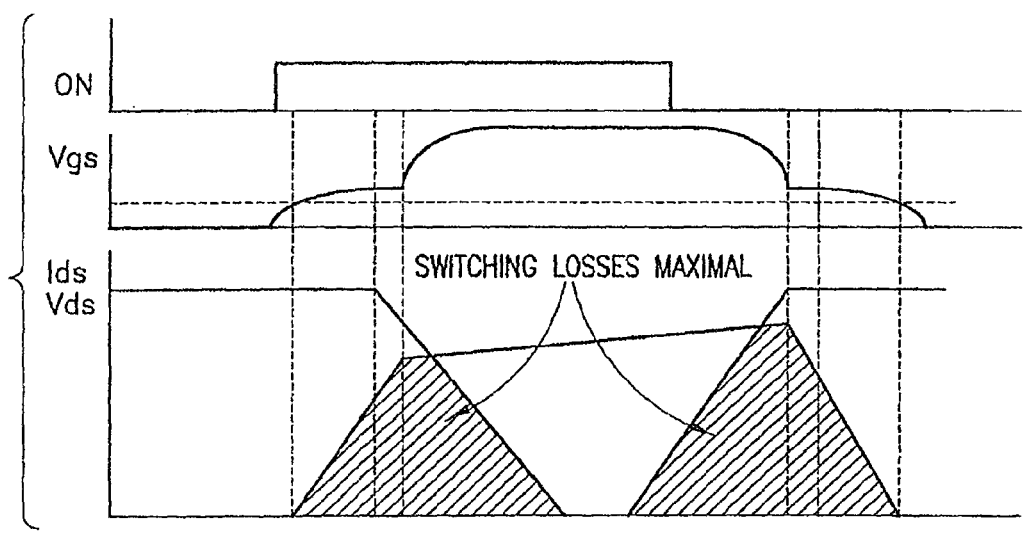
FIG. 2 is a timing diagram of signals in the switching circuit of FIG. 1.
Figure 3:
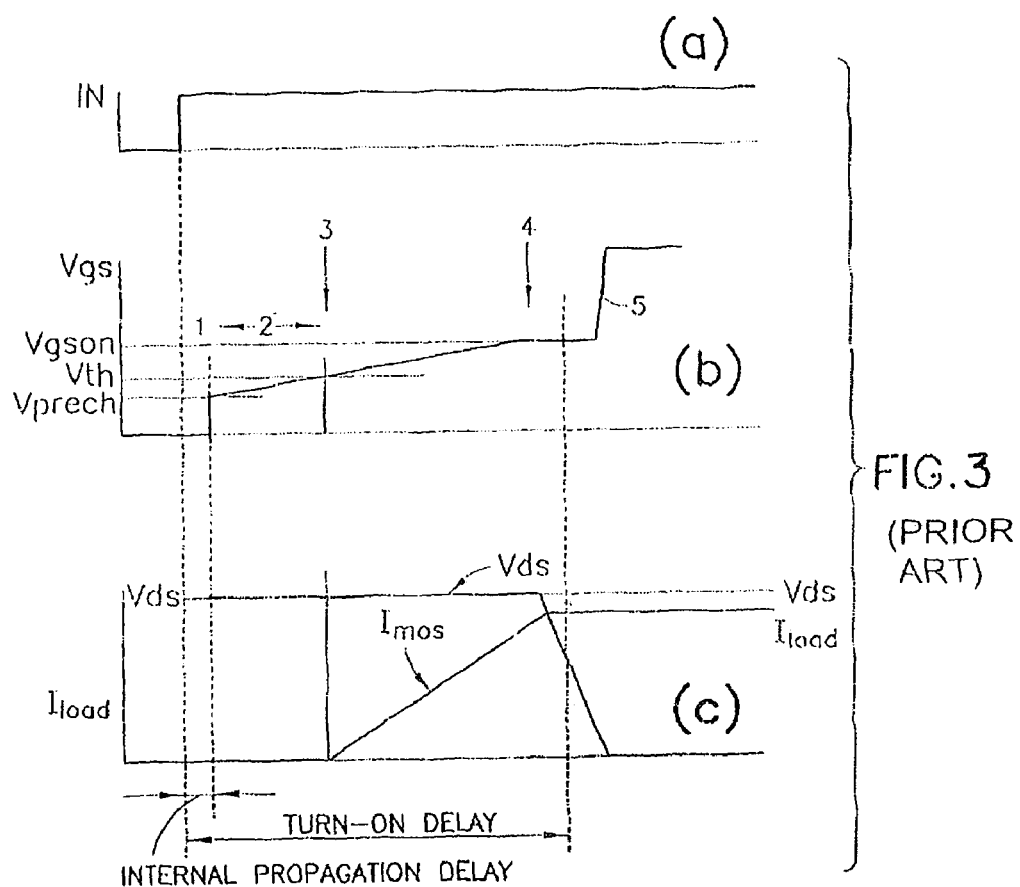
FIG. 3 is a block diagram illustrating a prior art method for reducing EMI using gate shaping.

The circuit 1 of FIG. 9A also includes a charge pump diode 36 and a bootstrap diode connected to the high ON and low ON current sources. These two diodes create an OR gate and allow the driver to operate at 100% Duty Cycle, thus, no bootstrap capacitor refresh is needed. When the bootstrap capacitor is fully discharged, a charge pump helps to keep the gate terminal 6V over Vbat (FIGS. 1 and 6B).

Figure 9B:
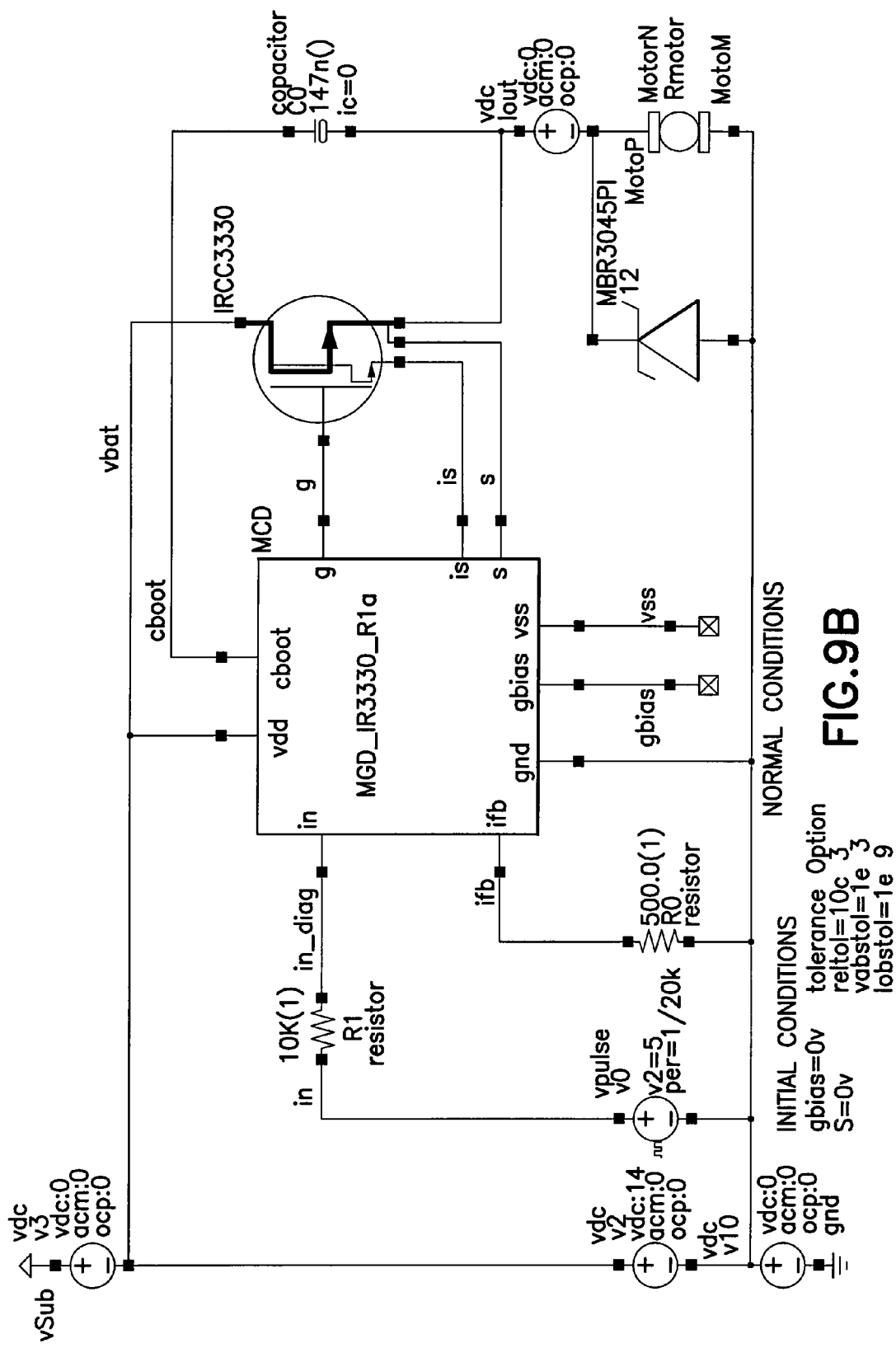
FIGS. 9B and 9C are circuit diagrams of an implementation of the di/dt control MOS gate driver of the present invention.
Figures 1, 9C:
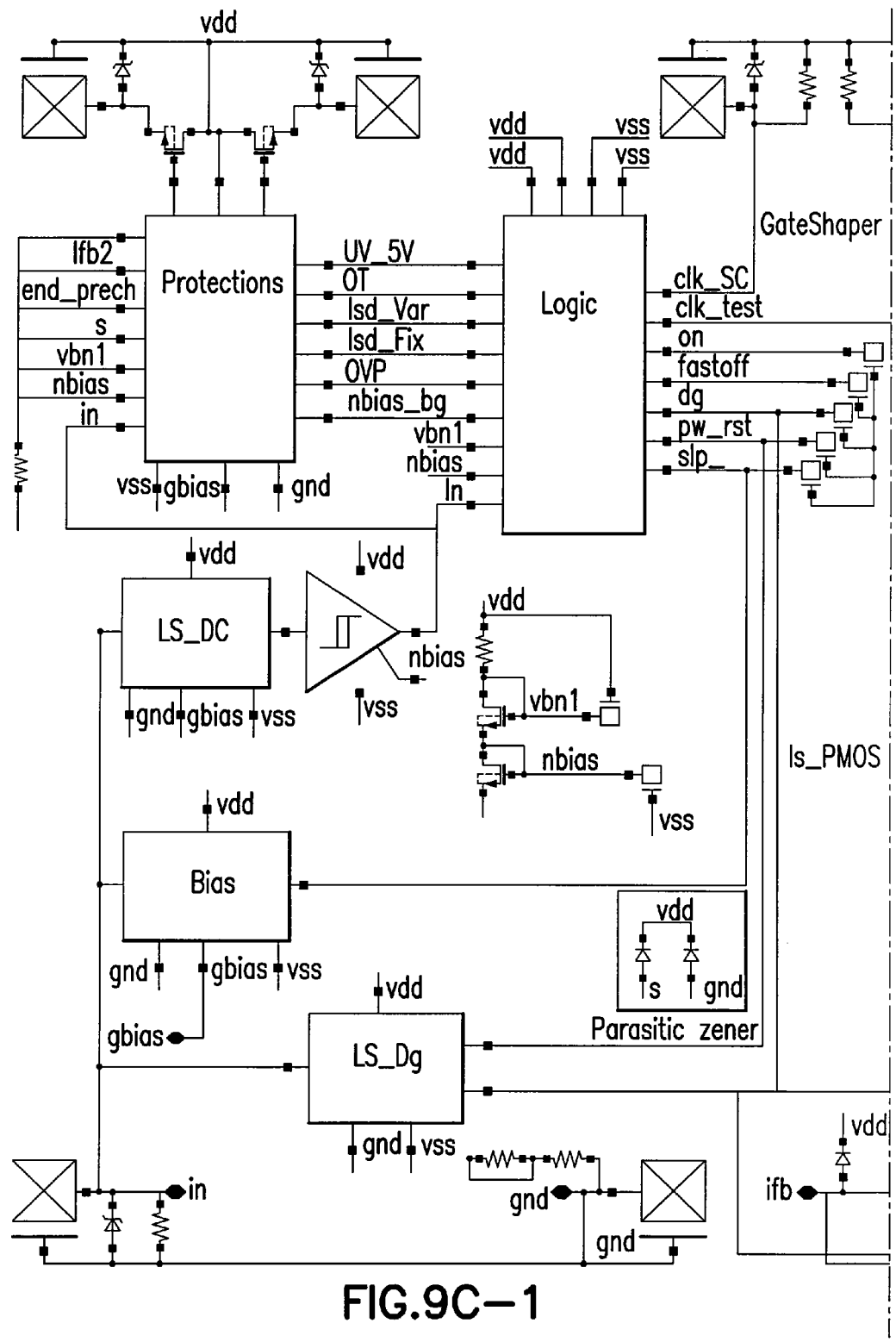
Figures 2, 9C:
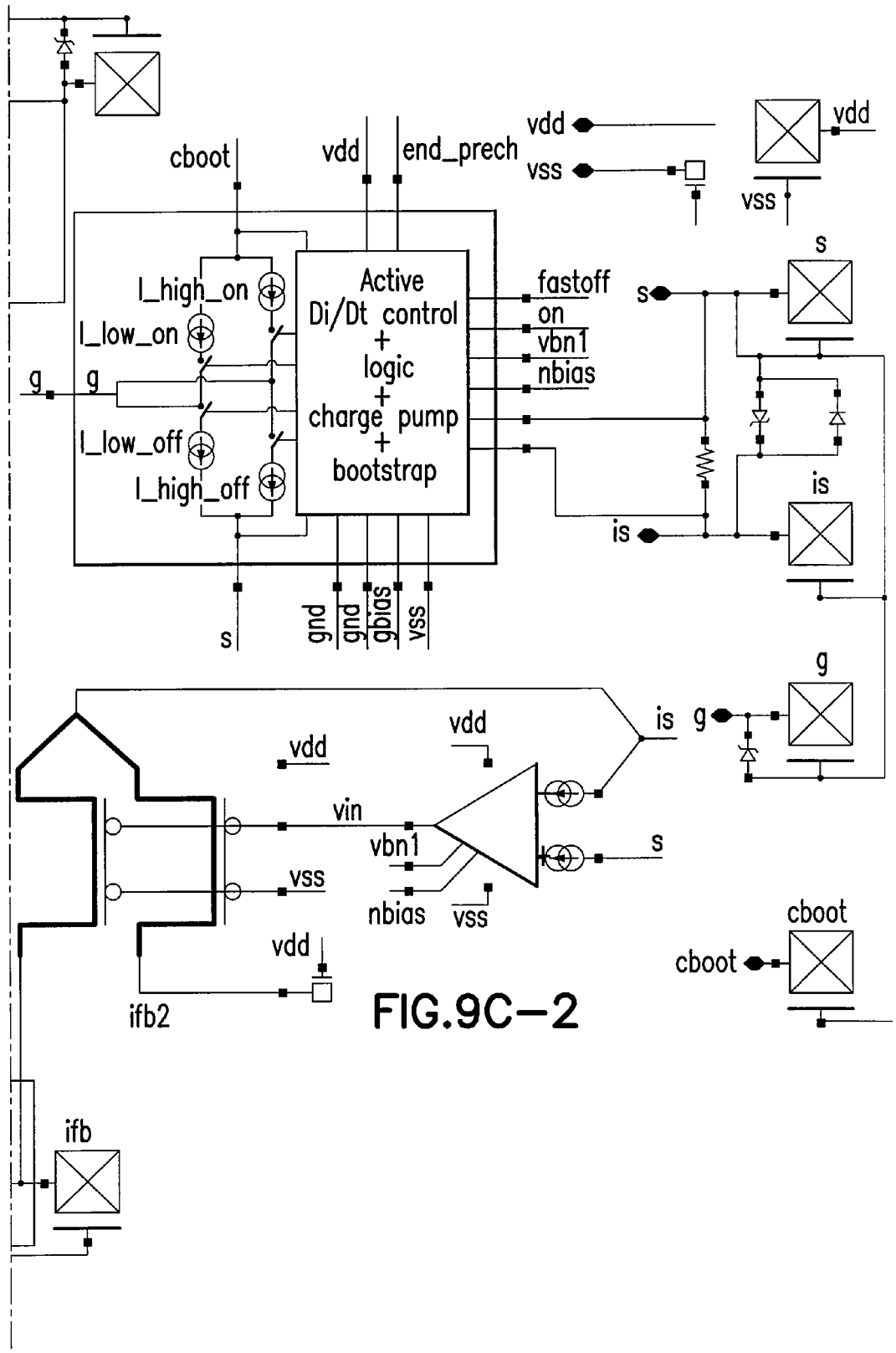

FIGS. 9B and 9C are circuit diagrams of one implementation of the MOS gate driver, which provides the di/dt and dv/dt ON and OFF signals based on following logic control equation:

$$Pre\_ch = ON/OFF \bullet End\_prech \bullet \overline{Fast(OFF)}$$

$$di/dt(ON) = ON/OFF \bullet \overline{Fast(OFF)}$$

$$dv/dt(ON) = ON/OFF \bullet Vs\_1v \bullet \overline{Fast(OFF)}$$

$$di/dt(OFF) = \overline{ON/OFF} + Fast(OFF)$$

$$dv/dt(OFF) = \overline{(ON/OFF \bullet Vs\_1v)} + Fast(OFF)$$

$$Dis\_ch = \overline{ON/OFF} \bullet End\_prech \bullet \overline{Fast(OFF)}$$

Over Power Protection

During the turn ON or the turn OFF phase (linear mode), the current feedback is not available (Vs<Vss). So it is not possible to use this feature to protect the MOSFET against the over current. The di/dt control allows for a development of a new kind of circuit to protect the MOSFET during the turn ON phase against an over current condition.

For example, if the di/dt. value is set up at 20 Amps per microsecond, the current in the MOSFET can be estimated just by measuring the time that the source takes to go up to Vdd. In the present case, after 3 .mu.s if the signal Vds.sub.—075v is not present (the MOSFET is not fully ON, Vs far away from Vdd), it means that the current in the load is up to 60 amps (20 A/.mu.s*3 .mu.s=60 A). Considering this value is too high for the specific application, the MOSFET must be turned OFF immediately, to avoid the part heating up too much and blowing-up.

The present system protects against all conditions which lead the MOSFET to be in linear mode (like a short duty cycle, short circuit, bootstrap capacitor disconnected) and keeps memory of the dissipated power stored during several successive turn-ON endeavors. The system reflects the power of switching losses, and protection can be provided very close to the maximum power dissipation, allowing the application to operate close to maximum power without a degrading performance.

Figure 10A:
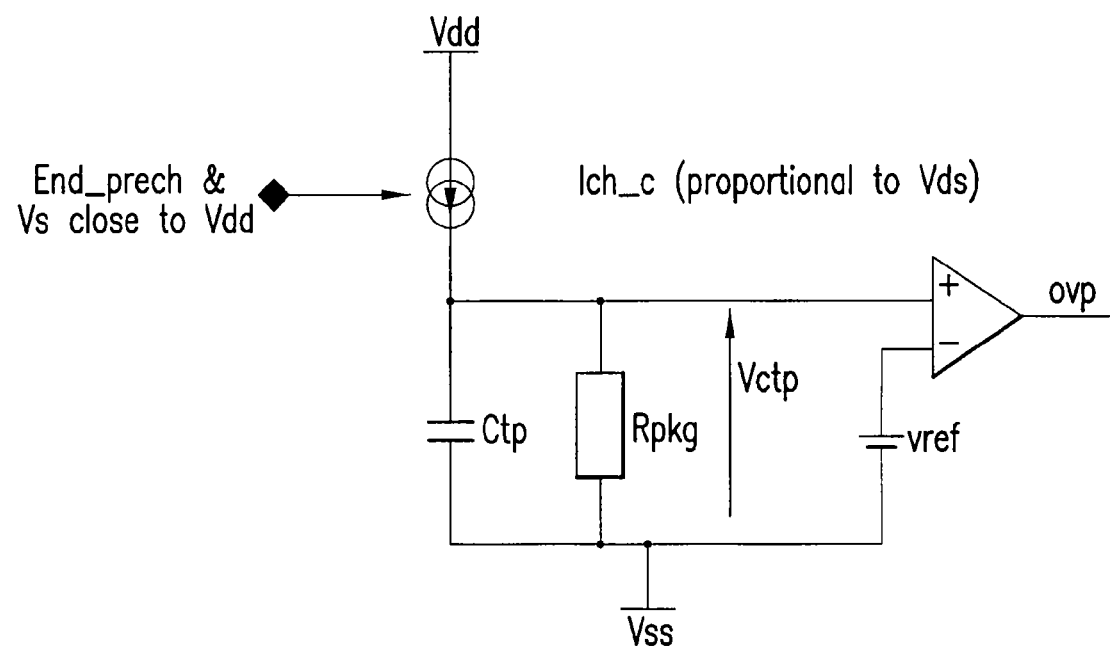
FIG. 10A is a block diagram of the Overpower Protection circuit of the present invention.

FIG. 10A illustrates a circuit diagram of principle of the Overpower Protection circuit in which "End_prech & Vds close to Vdd" means that the MOSFET's driver controls the Ids slope, since the Vth has been reached (End_prech=1). Normal, short circuit, and repetitive short pulses conditions are considered below.

In normal condition a capacitor Ctp is charged with a current Ich_c, which is proportional to Vds, whilst the signal End_prech is up and until the MOSFET is fully ON (Vds close to Vdd). When the MOSFET is fully ON, the capacitor Ctp is discharged via a resistor Rpkg, which represent the Rth.

Figure 10B:
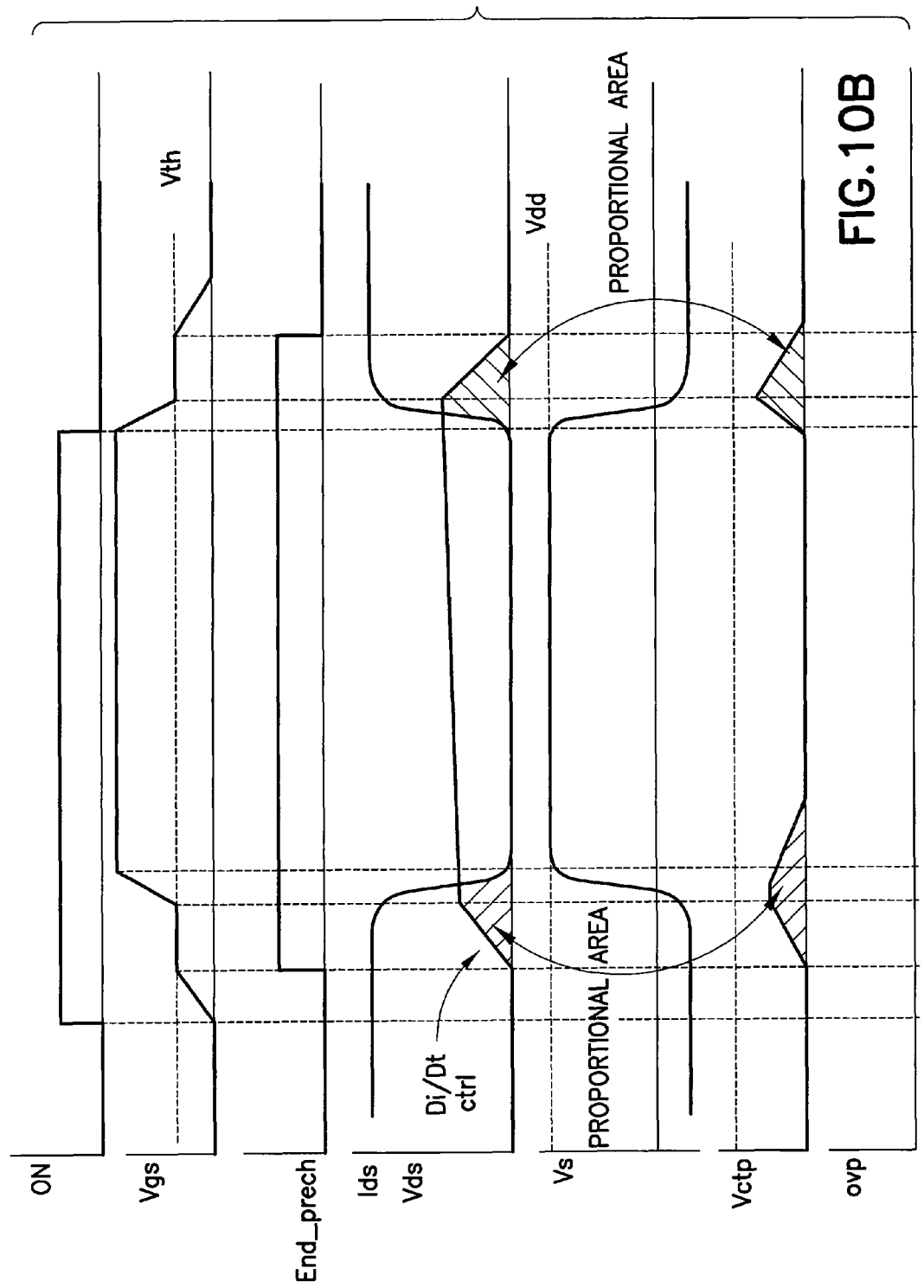
FIG. 10B is a timing diagram of the Overpower Protection circuit of FIG. 10A in normal condition.

Voltage Vctp did not reach Vref so, Ovp signal stays low. The timing diagram of the Overpower Protection circuit in normal condition is illustrated in FIG. 10B.

Figure 10C:
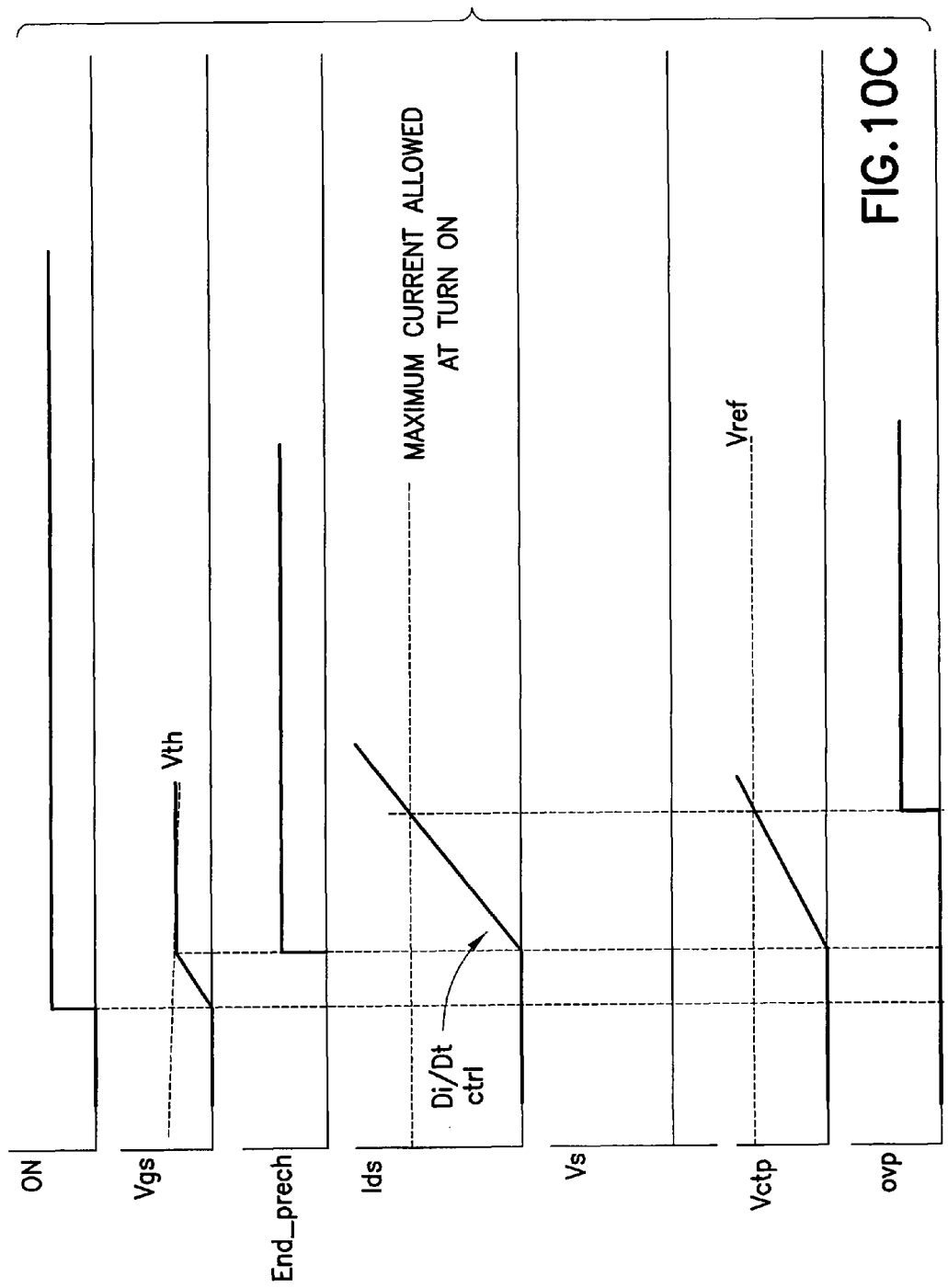
FIG. 10C is a timing diagram of the Overpower Protection circuit of FIG. 10A in short circuit condition.

In short circuit condition the current source Ich_C is activated and charges the capacitor Ctp until the voltage Vctp reaches the reference voltage Vref, since the Vs is bolted to ground. At this moment, Ovp signal rises up to flag the maximum switching losses it is allowed to reach. The timing diagram of the Overpower Protection circuit in short circuit condition is illustrated in FIG. 10C.

Figure 10D:
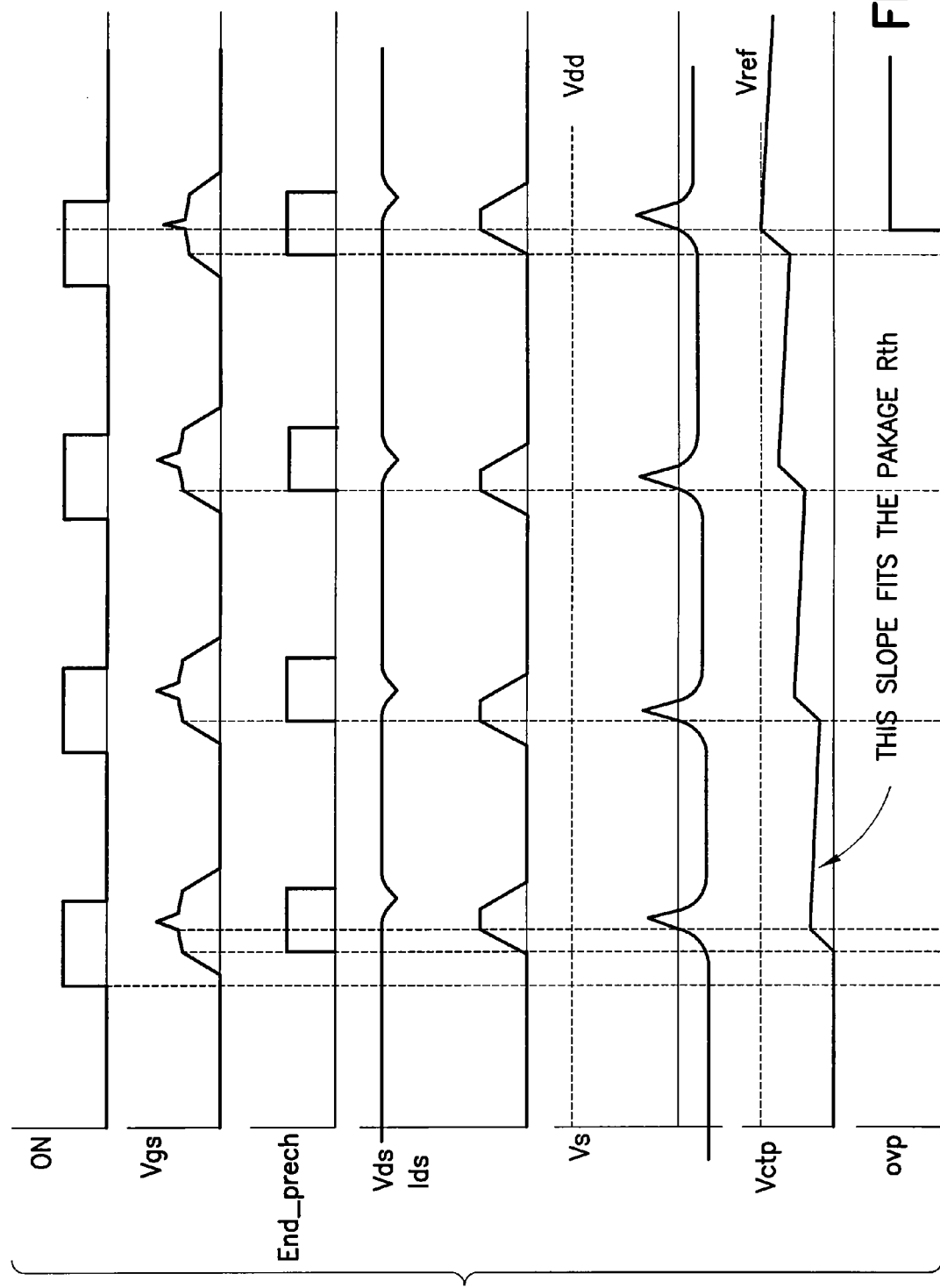
FIG. 10D is a timing diagram of the of the Overpower Protection circuit of FIG. 10A in repetitive short pulses condition.

In short pulses condition, the MOSFET has not enough time to fully turn-ON, so during each short pulse it works in linear, and heats up a lot. As the source never goes up to Vdd the capacitor Ctp is never reset by S1, but it is slowly discharged by resistor Rpkg. This resistor represents the thermal resistance of the package. So if the pulse frequency is too high, the capacitor Ctp never discharges completely (Rpkg), and pulse by pulse voltage Vctp goes closer and closer to reference voltage Vref. The timing diagram of the Overpower Protection circuit in repetitive short pulses condition is illustrated in FIG. 10D.

Over Power Protection—Preferred Embodiment

Figure 11A:
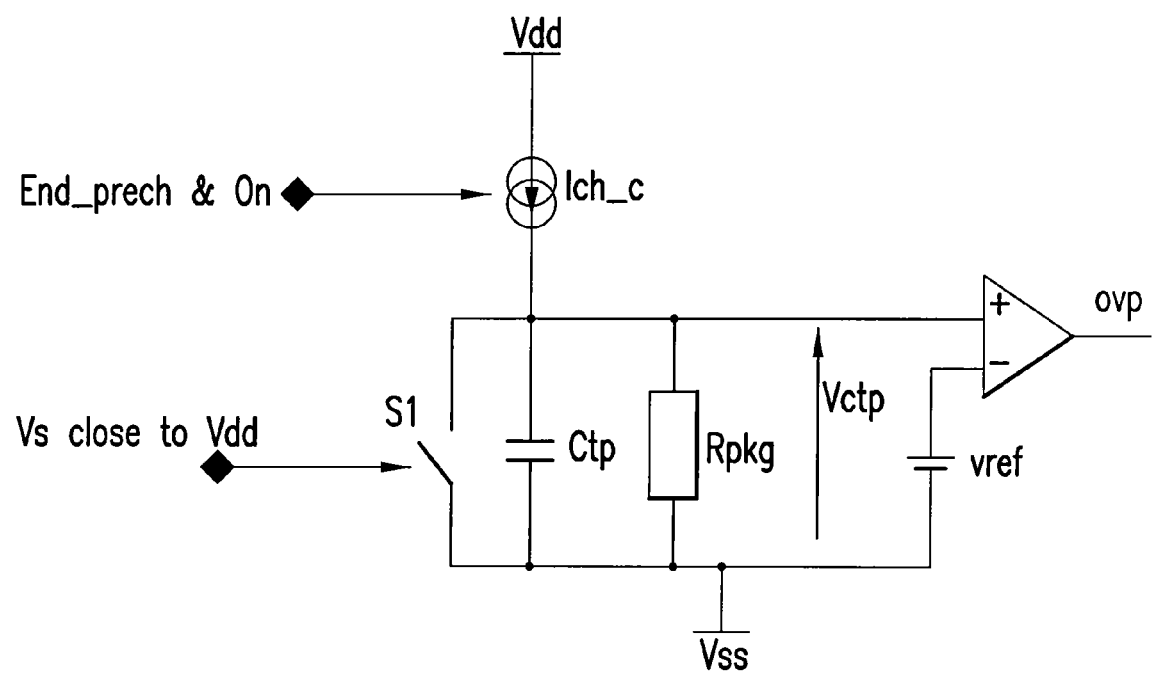
FIG. 11A is a block diagram of the Overpower Protection circuit of the preferred embodiment of the present invention.

The above-described circuit does not take into account turn-OFF switching losses. But the preferred embodiment described below protects against the short circuit, because the probability to have a short circuit exactly during turn-OFF is very low and even if it happened the MOSFET will sustain the power and the fault will automatically be detected at the next turn ON. This embodiment, illustrated in FIG. 11A, where "End_prech & ON" means that the MOSFET is in its Turn-On phase (In=1) and that the driver control the Ids slope, since the Vth has been reached (End_prech=1) is explained here under. Normal, short circuit, and repetitive short pulses conditions are considered.

Figure 11B:
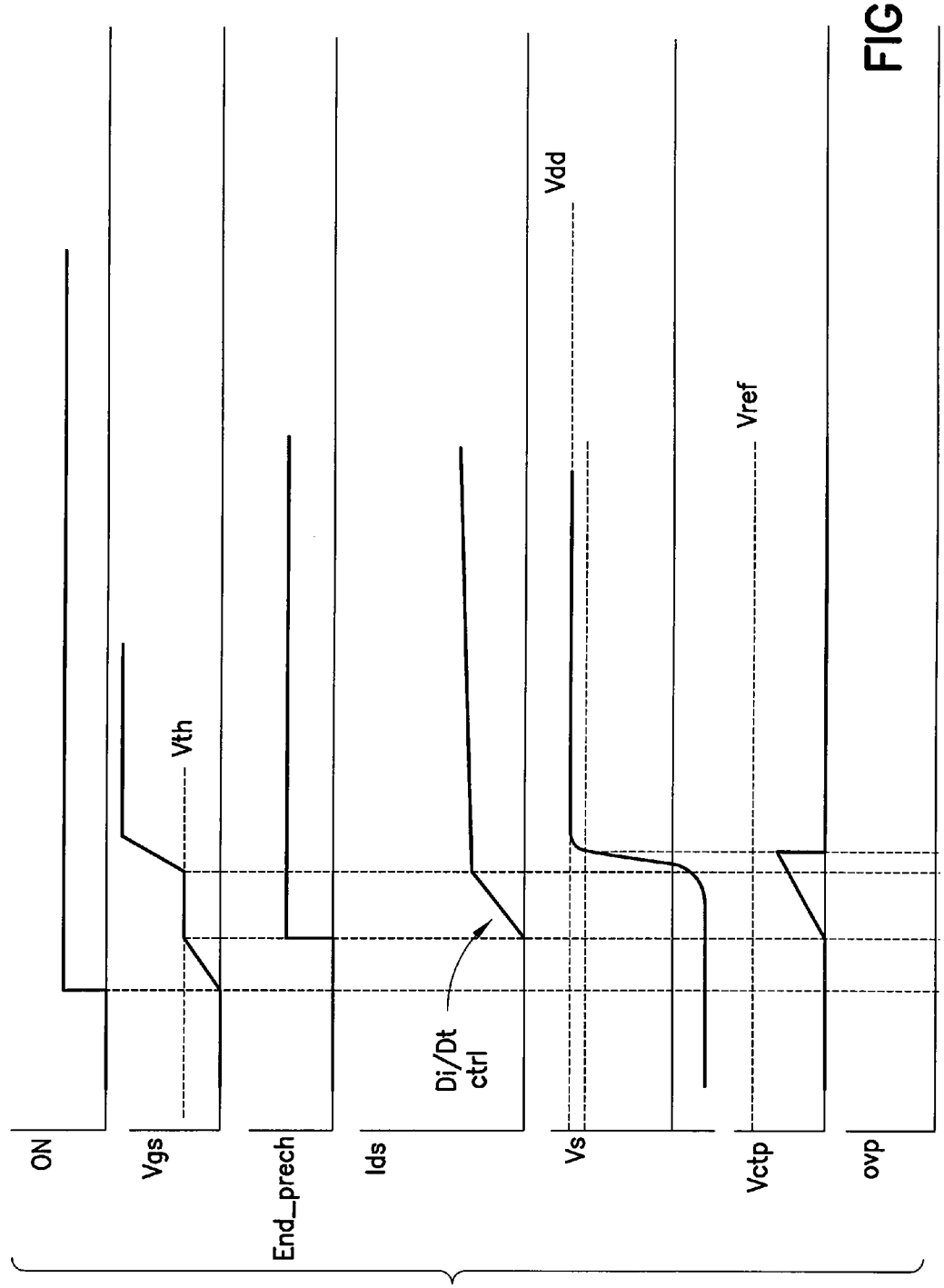
FIG. 11B is a timing diagram of the of the Overpower Protection circuit of FIG. 11A in normal condition.

In normal condition the current source Ich_C is activated and charges capacitor Ctp until the MOSFET is fully ON (Vds close to Vdd). At this moment S1 is closed and capacitor Ctp is discharged, voltage Vctp did not reach reference voltage Vref so, Ovp signal stays low. The timing diagram of the Overpower Protection circuit in normal condition is illustrated in FIG. 11B.

Figure 11C:
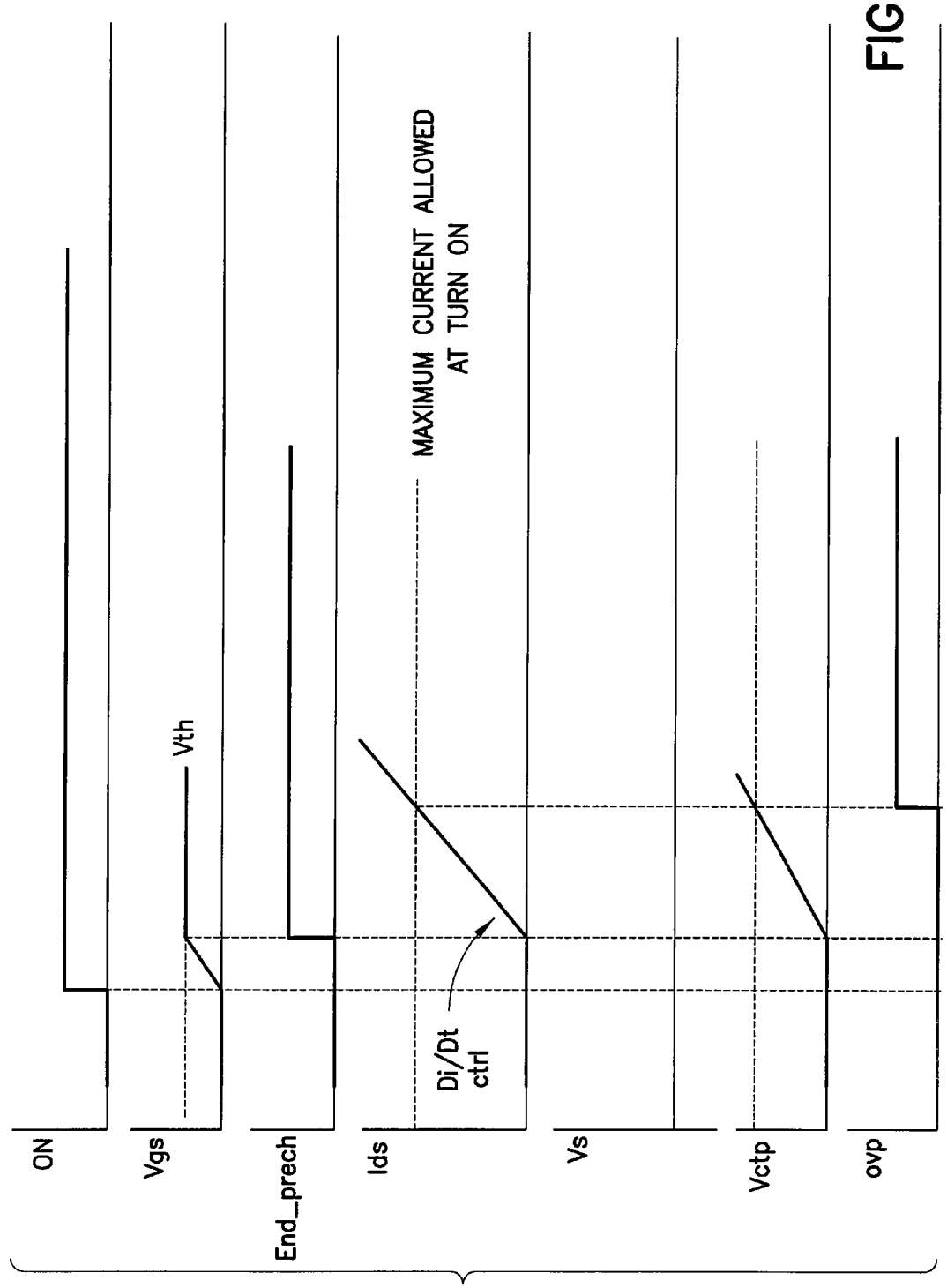
FIG. 11C is a timing diagram of the of the Overpower Protection circuit of FIG. 11A in short circuit condition.

In short circuit condition the current source Ich_C is activated and charges capacitor Ctp until voltage Vctp reaches reference voltage Vref, since the Vs is bolted to ground. At this moment, Ovp signal rises up to flag the maximum switching losses it is allowed to reach. The timing diagram of the Overpower Protection circuit in short circuit condition is illustrated in FIG. 11C.

Figure 11D:
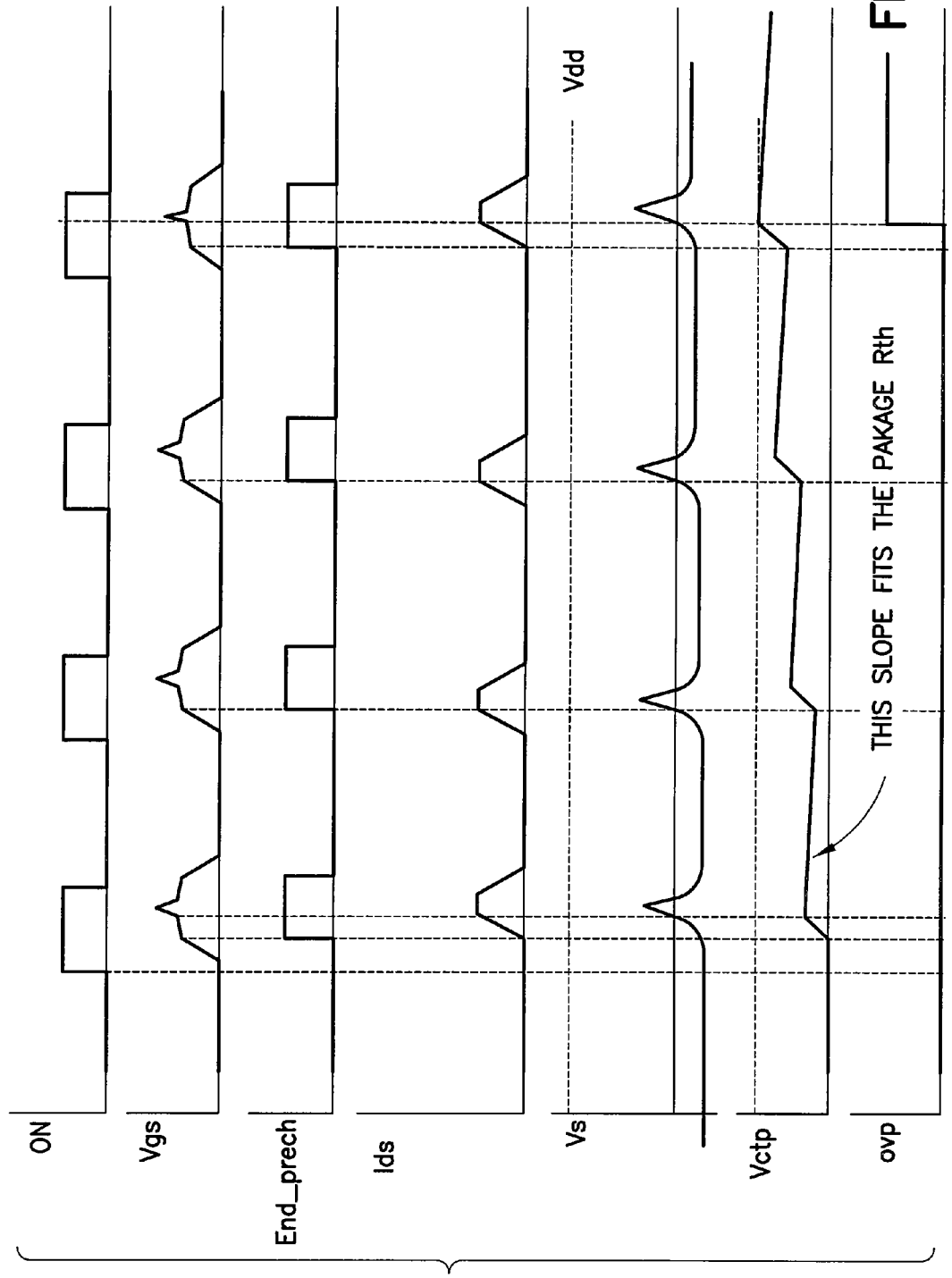
FIG. 11D is a timing diagram of the of the Overpower Protection circuit of FIG. 11A in repetitive short pulses condition.

In short pulses condition, the MOSFET has not enough time to fully turn-ON, so during each short pulse it works in linear, and heats up a lot. As the source never goes up to Vdd capacitor Ctp is never reset by S1, but it is slowly discharged by resistor Rpkg. This resistor represents the thermal resistance of the package. So if the pulse frequency is too high, the capacitor never discharges completely (Rpkg), and pulse by pulse voltage Vctp goes closer and closer to reference voltage Vref. The timing diagram of the Overpower Protection circuit in repetitive short pulses condition is illustrated in FIG. 11D.

Figure 11E:
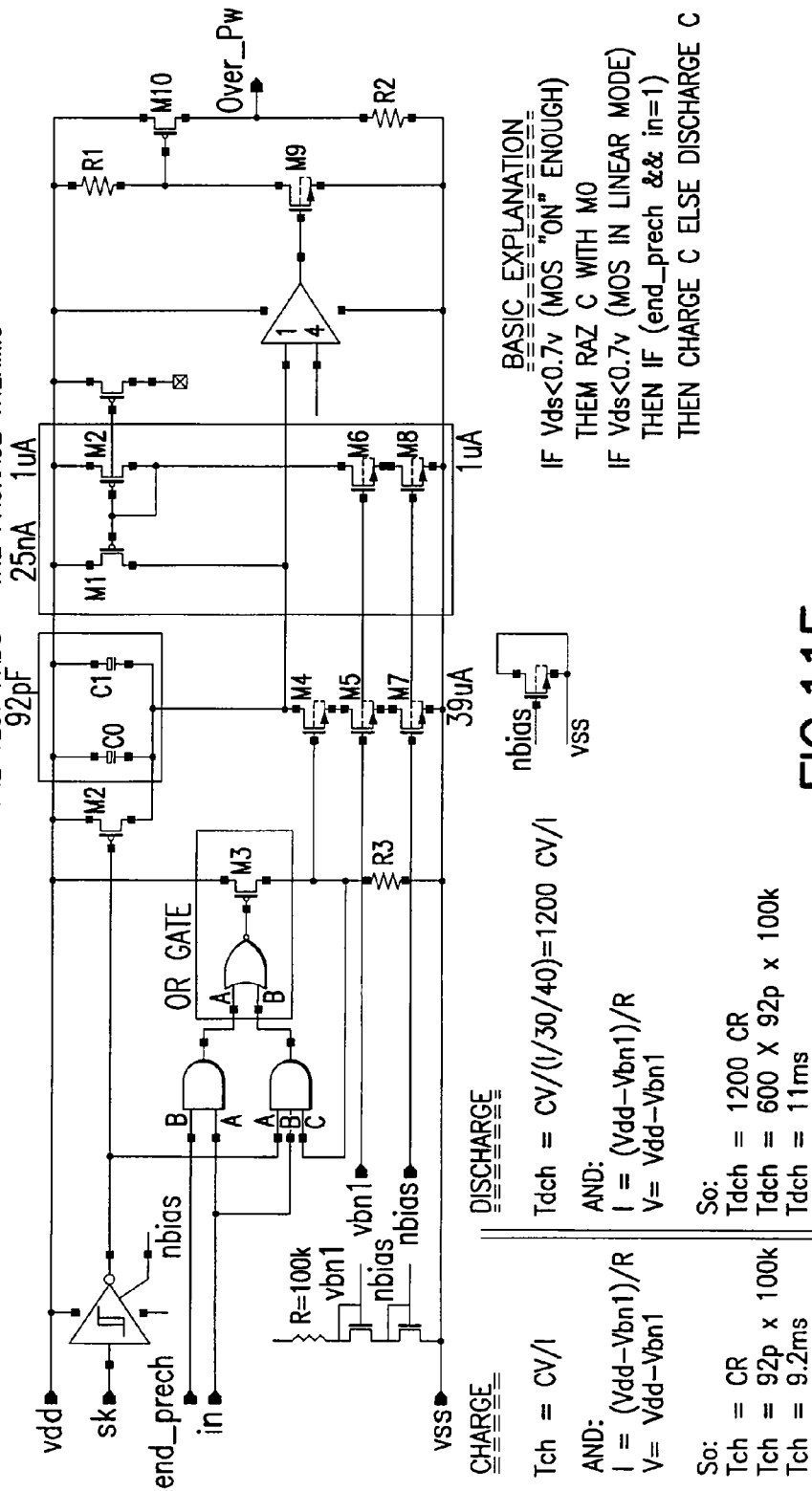
FIG. 11E is a circuit diagram of an implementation of the Overpower Protection circuit of the preferred embodiment of the present invention.

An implementation of the Overpower Protection circuit of the preferred embodiment is illustrated in FIG. 11E.

Other possible applications of the circuit of the preferred embodiment include Control of the power dissipated and therefore the temperature variation during normal operation and thus increase the reliability of the component during a fault mode. This protection will also work to protect a MOSFET located far away from the driver.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method for use by a gate driver circuit to drive a first transistor having gate, source, and drain terminals, the first transistor being part of a switching stage of a power switching circuit, the method comprising the following steps:
   upon receipt of an ON pulse
      pre-charging the gate terminal with a pre-charge current, only until gate to source terminal voltage of the first transistor equals Vth,
      providing the gate with a low ON charging current until the source terminal rises to zero volts, and controlling the di/dt(ON) flowing in the first transistor while free wheeling current is flowing in a second transistor of the switching stage, and
      providing the gate with a high ON charging current, and controlling the dv/dt(ON) of the first transistor while a charge on the gate terminal is present; and
   upon receipt of an OFF pulse
      providing the gate with a high OFF discharging current until the source terminal falls to zero volts, and controlling the dv/dt(OFF) of the first transistor until free wheeling current is not flowing in the second transistor, and
      providing the gate with a low OFF discharging current until gate to source voltage of the first transistor falls below Vth and controlling the di/dt(OFF) flowing in the first transistor while the gate to source terminal voltage equals Vth,
   wherein the pre-charge and high ON charging currents are larger than the low ON charging current, and the high OFF discharging current is larger than the low OFF discharging current.

2. The method of claim 1, wherein:
   the step of pre-charging the gate terminal occurs subsequent to a predetermined internal propagation time after receipt of the ON pulse; and
   the step of controlling the dv/dt(OFF) occurs subsequent to a second predetermined internal propagation time after receipt of the OFF pulse.

3. The method of claim 1, wherein the step of pre-charging the gate terminal reduces the delay in turning ON the power switching circuit.

4. The method of claim 1, wherein the free wheeling current is not flowing in the second transistor when voltage at a switching node of the power switching circuit is zero volts, and is flowing when the voltage at the switching node is not zero volts.

5. The method of claim 1, wherein the steps of controlling the di/dt(ON) and di/dt(OFF) are achieved by controlling the charge on the gate terminal of the first transistor.

6. The method of claim 1, wherein the steps of controlling the dv/dt(ON) and dv/dt(OFF) reduce switching losses.

7. The method of claim 1, further comprising a step of terminating a discharge on the gate terminal of the first transistor and preparing for a new cycle when the gate to source terminal voltage of the first transistor substantially equals zero volts.

8. A gate driver for performing gate shaping of a drive signal for a first transistor having gate, source, and drain terminals, the first transistor being part of a switching stage of a power switching circuit, the gate driver comprising:

a detection circuit for upon receipt of an ON pulse detecting voltage Vth, the gate driver pre-charging the gate terminal of the first transistor until the gate to source terminal voltage of the first transistor equals Vth, a logic control circuit for
controlling the di/dt(ON) flowing in the first transistor after receipt of an ON pulse while free wheeling current is flowing in a second transistor of the switching stage, and
controlling the di/dt(OFF) flowing in the first transistor after receipt of an OFF pulse while the gate to source terminal voltage equals Vth;

a first control circuit for controlling the dv/dt(ON) of the first transistor after receipt of an ON pulse while a charge on the gate terminal is present; and a second control circuit for upon receipt of an OFF pulse controlling the dv/dt(OFF) of the first transistor until free wheeling current is not flowing in the second transistor.

9. The gate driver of claim 8, wherein the detection circuit comprises:
a third transistor having gate, source, and drain terminals, the gate and drain terminals of the third transistor being connected to the drain terminals of the first transistor, the gate terminals of the first and third transistors are connected to a pre-charge voltage source;
a resistor coupled between the source terminal of the third transistor and the source terminal of the first transistor; and
a comparator having a positive terminal coupled to the source terminal of the third transistor and a negative terminal connected to a reference source providing reference voltage, wherein an output of the comparator flips when voltage on the resistor reaches the reference voltage indicating that the first transistor has reached voltage Vth.

10. The gate driver of claim 8, wherein the first control circuit comprises:
a third transistor having gate, source, and drain terminals, the source terminal of the third transistor being connected to a current source;
a diode connected between the gate terminal of the third transistor and a switching node of the power switching circuit; and
a first resistor coupled between the gate terminal of the third transistor and the drain terminal of the first transistor.

11. The gate driver of claim 10, wherein the first control circuit further comprises:
a fourth transistor having gate, source, and drain terminals, the gate of the fourth transistor being connected to the drain terminal of the second transistor and the drain of the fourth transistor being connected to the gate of the first transistor; and
a second resistor coupled to the gate terminal of the fourth transistor and the source terminal of the fourth transistor, wherein a high current source provides current to the source terminal of the fourth transistor and a low current source provides current to the gate terminal of the first transistor.

12. The gate driver of claim 8, wherein the second control circuit comprises a third transistor having gate, source, and drain terminals, the drain terminal of the third transistor being connected to the gate terminal of the first transistor, the gate terminal of the third transistor being connected to the switching node, and the source terminal of the third transistor being connected to ground.

13. The gate driver of claim 8, wherein the logic circuit comprises:
ON/OFF signal, Fast(ON) signal, a signal indicating detection of voltage at a switching node of the power switching circuit, and if the voltage at the switching node larger than a preset reference value; and
a plurality of output signals for directing the logic circuit to perform di/dt(ON and OFF), dv/dt(ON and OFF), pre-charge and discharge functions,
wherein the output signal for
di/dt(ON) is calculated as: ON/OFF●$\overline{\text{Fast(OFF)}}$,
di/dt(OFF) is calculated as: $\overline{\text{ON/OFF}}$+Fast(OFF),
dv/dt(ON) is calculated as: ON/OFF●Vs_1v●$\overline{\text{Fast(OFF}}$,
dv/dt(OFF) is calculated as: $\overline{\text{(ON/OFF}}$●Vs_1v)+Fast(OFF),
pre-charge is calculated as: ON/OFF●End_prech●$\overline{\text{Fast(OFF)}}$, and
discharge is calculated as: $\overline{\text{ON/OFF}}$●End_prech●$\overline{\text{Fast(OFF)}}$.

14. The gate driver of claim 13, further comprising:
a plurality of switches; and
a plurality of current sources comprising low ON, high ON, pre-charge, discharge, low OFF, and high OFF current sources, a respective switch of the plurality of switches connecting each of the current sources to the gate of the first transistor,
wherein
the di/dt(ON) output signal controls the connection of low ON current source,
the di/dt(OFF) output signal controls the low OFF current source, and
the dv/dt(ON) output signal controls the connection of high ON current source,
the dv/dt(OFF) output signal controls the high OFF current source,
the precharge output signal controls the pre-charge current source, and
the discharge output signal controls the discharge current source.

15. The gate driver of claim 8, further including an overpower protection circuit comprising:
a comparator for providing an output signal indicating overpower, the comparator having positive and negative terminals, the negative terminal being connected to a reference voltage,
a capacitor connected to the positive terminal, and
a resistor parallel connected to the capacitor, wherein
the capacitor is charged from a current source while the gate to source terminal voltage is about equal Vth after the ON pulse is received.

16. The gate driver of claim 15, wherein
in a normal condition the capacitor is charged until the first transistor is fully ON,
in short circuit condition the capacitor is charged until the reference voltage is reached and the comparator providing the output signal indicating overpower, and
in repetitive short pulse condition the resistor discharges the capacitor.

17. The gate driver of claim 16, wherein the overpower protection circuit further comprising a switch connected across the capacitor for discharging the capacitor in the normal condition.

* * * * *